(12) United States Patent
Kato et al.

(10) Patent No.: US 9,209,011 B2
(45) Date of Patent: Dec. 8, 2015

(54) METHOD OF OPERATING FILM DEPOSITION APPARATUS AND FILM DEPOSITION APPARATUS

(71) Applicant: Tokyo Electron Limited, Tokyo (JP)

(72) Inventors: Hitoshi Kato, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 297 days.

(21) Appl. No.: 13/932,154

(22) Filed: Jul. 1, 2013

(65) Prior Publication Data

US 2014/0011370 A1    Jan. 9, 2014

(30) Foreign Application Priority Data

Jul. 6, 2012 (JP) .................. 2012-152659

(51) Int. Cl.
| | |
|---|---|
| *B44C 1/22* | (2006.01) |
| *H01L 21/02* | (2006.01) |
| *C23C 16/02* | (2006.01) |
| *C23C 16/455* | (2006.01) |
| *H01J 37/32* | (2006.01) |

(52) U.S. Cl.
CPC ........ *H01L 21/0206* (2013.01); *C23C 16/0227* (2013.01); *C23C 16/45551* (2013.01); *H01J 37/321* (2013.01); *H01J 37/3211* (2013.01); *H01J 37/32449* (2013.01); *H01J 37/32513* (2013.01); *H01J 37/32651* (2013.01); *H01J 37/32715* (2013.01); *H01J 37/32733* (2013.01); *H01J 37/32862* (2013.01)

(58) Field of Classification Search
CPC ............... H01L 21/02057; H01L 21/0206; H01L 21/02301; C23C 16/0227; C23C 16/4405; C23C 16/45551
USPC ....................... 216/37, 58; 118/719, 729, 730
See application file for complete search history.

(56) References Cited

U.S. PATENT DOCUMENTS

| | | | | |
|---|---|---|---|---|
| 2007/0215036 A1* | 9/2007 | Park et al. | ......... | C23C 16/45551 117/88 |
| 2007/0218702 A1* | 9/2007 | Shimizu | .................. | C23C 16/06 438/758 |
| 2010/0055347 A1* | 3/2010 | Kato et al. | ............. | C23C 16/452 427/569 |
| 2011/0039026 A1* | 2/2011 | Kato | ..................... | C23C 16/402 427/255.26 |
| 2012/0247670 A1* | 10/2012 | Dobashi | ............ | H01L 21/67028 156/345.31 |
| 2013/0045587 A1* | 2/2013 | Kraus et al. | ....... | H01L 21/02532 438/478 |

FOREIGN PATENT DOCUMENTS

| | | |
|---|---|---|
| JP | 2011-100956 | 5/2011 |
| WO | 2013141159 | 9/2013 |

* cited by examiner

*Primary Examiner* — Binh X Tran
(74) *Attorney, Agent, or Firm* — IPUSA, PLLC

(57) ABSTRACT

A method of operating a film deposition apparatus including a turntable provided in a vacuum chamber and configured to rotate a substrate mounted thereon, a first reaction gas supplying portion, a second reaction gas supplying portion, a separation area, a first vacuum evacuation port for mainly evacuating the first reaction gas, a second vacuum evacuation port for mainly evacuating the second reaction gas, and a cleaning gas supplying portion for supplying a cleaning gas to clean the turntable, the method includes a cleaning step of supplying the cleaning gas from the cleaning gas supplying portion into the vacuum chamber while terminating the evacuation from the first vacuum evacuation port and performing the evacuation from the second vacuum evacuation port.

8 Claims, 15 Drawing Sheets

METHOD OF OPERATING FILM DEPOSITION APPARATUS AND FILM DEPOSITION APPARATUS

CROSS-REFERENCE TO RELATED APPLICATION

The present application is based on and claims the benefit of priority of Japanese Priority Application No. 2012-152659 filed on Jul. 6, 2012, the entire contents of which are hereby incorporated herein by reference.

BACKGROUND OF THE INVENTION

1. Field of the Invention

The present invention relates to a method of operating a film deposition apparatus and a film deposition apparatus.

2. Description of the Related Art

As methods of film deposition techniques in semiconductor manufacturing processes, a so-called Atomic Layer Deposition (ALD) method is known. In the ALD method, a reaction product is deposited by alternately supplying a plurality of kinds of reaction gasses capable of reacting with each other on a surface of a semiconductor wafer (hereinafter, simply referred to as a "wafer"). In an apparatus to perform the ALD method, a plurality of wafers mounted on a turntable are rotated by the turntable to alternately pass through a plurality of reaction gas supplying areas to which reaction gasses are supplied. In this apparatus, separation areas, to which a separation gas which is an inert gas such as nitrogen gas or the like is provided, are provided between the plurality of the reaction gas supplying areas in a rotation direction of the turntable for preventing mixing of the plurality of reaction gasses (for separating the plurality of reaction gasses). Further, vacuum evacuation ports are provided on a downstream side of the reaction gas supplying areas in the rotation direction of the turntable to evacuate the reaction gasses together with the separation gas.

The plurality of reaction gasses may be, for example, a source gas that is adsorbed on a surface of the wafer and a gas that oxidizes or nitrizes the source gas. Here, when the separation gas is introduced into a source gas supplying area in accordance with the rotation of the turntable, the source gas is diluted by the separation gas to lower the across-the-wafer uniformity in the thickness of a thin film. Thus, in this case, it is necessary to increase the flow rate of the source gas, which causes an increase in cost.

In Patent Document 1, a technique is disclosed in which a flow regulating plate is provided on a gas nozzle extending in a radius direction of a turntable so that the introduction of the separation gas into the source gas supplying area is suppressed and the separation gas tends to flow over the flow regulating plate.

Meanwhile, when performing the film deposition process, a thin film is formed not only on the wafer but also on an upper surface of the turntable. When the thickness of the film formed on the turntable becomes thick after repeating the film deposition process, particles may be generated due to peeling of the film. Thus, it is necessary to periodically remove the thin film formed on the turntable by a cleaning gas.

Here, a position at which a cleaning gas supplying portion is provided may be limited in order to perform a cleaning process while preventing damage to a film deposition apparatus.

For example, wafers are carried in and carried out by an external substrate transferring mechanism at an area (which will be referred to as a "passing area") in the film deposition apparatus. Generally, a monitor for monitoring the passing of the wafers is provided at the passing area. Thus, in order to prevent deterioration of the monitor by the cleaning gas, it is better to provide the cleaning gas supplying portion apart from the passing area. Therefore, a layout may be considered in which the cleaning gas supplying portion is positioned in the vicinity of the source gas supplying area, which is apart from the passing area. However, as described above, if a flow regulating plate is provided on a gas nozzle, the cleaning gas may flow over the flow regulating plate, similarly as the separation gas, so that the amount of the cleaning gas that contacts the turntable is reduced. This increases cleaning time.

Thus, it is necessary to direct gas flow in order to effectively perform the cleaning process on the turntable.

Patent Document

[Patent Document 1] Japanese Laid-open Patent Publication No. 2011-100956

SUMMARY OF THE INVENTION

The present invention is made in light of the above problems, and provides an apparatus in which a film deposition process is performed by rotating a substrate by a turntable and alternately supplying a plurality of different reaction gasses on the substrate, capable of rapidly performing a cleaning process on the turntable.

According to an embodiment, there is provided a method of operating a film deposition apparatus in which a cycle of alternately supplying different reaction gasses to a substrate is repeated to stack layers of a reaction product to form a thin film. The film deposition apparatus includes a vacuum chamber, a turntable provided in the vacuum chamber and configured to rotate a substrate mounted thereon, a first reaction gas supplying portion that supplies a first reaction gas to the substrate, a second reaction gas supplying portion, being apart from the first reaction gas supplying portion in a rotation direction of the turntable, that supplies a second reaction gas to the substrate, a separation area, provided between the first reaction gas supplying portion and the second reaction gas supplying portion in the rotation direction of the turntable of a film deposition process, and to which a separation gas for separating the first reaction gas and the second reaction gas is supplied, a first vacuum evacuation port for mainly evacuating the first reaction gas, a second vacuum evacuation port, being apart from the first vacuum evacuation port in the rotation direction of the turntable, for mainly evacuating the second reaction gas, and a cleaning gas supplying portion for supplying a cleaning gas to clean the turntable. The method includes a cleaning step of supplying the cleaning gas from the cleaning gas supplying portion into the vacuum chamber while terminating the evacuation from the first vacuum evacuation port and performing the evacuation from the second vacuum evacuation port.

According to another embodiment, there is provided a film deposition apparatus in which a cycle of alternately supplying different reaction gasses to a substrate is repeated to stack layers of a reaction product to form a thin film, including: a vacuum chamber; a turntable provided in the vacuum chamber and configured to rotate a substrate mounted thereon; a first reaction gas supplying portion that supplies a first reaction gas to the substrate; a second reaction gas supplying portion, being apart from the first reaction gas supplying portion in a rotation direction of the turntable, that supplies a second reaction gas to the substrate; a separation area, provided between the first reaction gas supplying portion and the second reaction gas supplying portion in the rotation direction of the turntable of a film deposition process, and to which a separation gas for separating the first reaction gas and the second reaction gas is supplied; a first vacuum evacuation port for mainly evacuating the first reaction gas; a second vacuum evacuation port, being apart from the first vacuum evacuation port in the rotation direction of the turntable, for mainly evacuating the second reaction gas; a cleaning gas supplying portion for supplying a cleaning gas to clean the turntable; and a control unit that outputs a control signal to execute a step of evacuating the vacuum chamber from the second vacuum evacuation port while terminating the evacuation from the first vacuum evacuation port, and a step of supplying, during the evacuation step, the cleaning gas from the cleaning gas supplying portion into the vacuum chamber.

Note that also arbitrary combinations of the above-described elements, and any changes of expressions in the present invention, made among methods, devices and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

Figure 1:
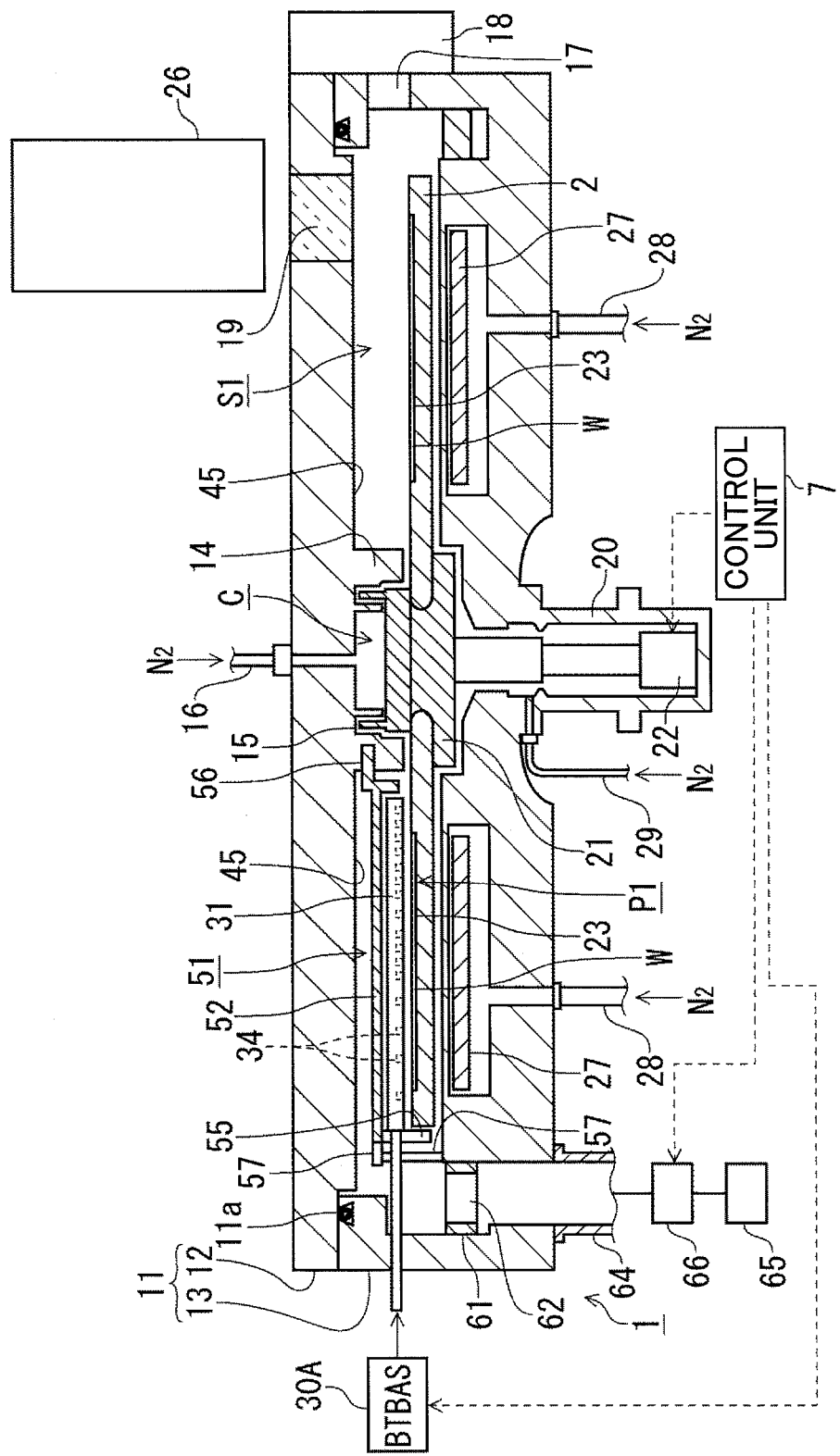
FIG. 1 is a vertical cross-sectional side view illustrating an example of a film deposition apparatus.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated. Further, drawings are not intended to show relative ratios of a component or components. Thus, specific sizes should be arbitrarily determined based on the non-limiting embodiments explained in the following.

Figure 2:
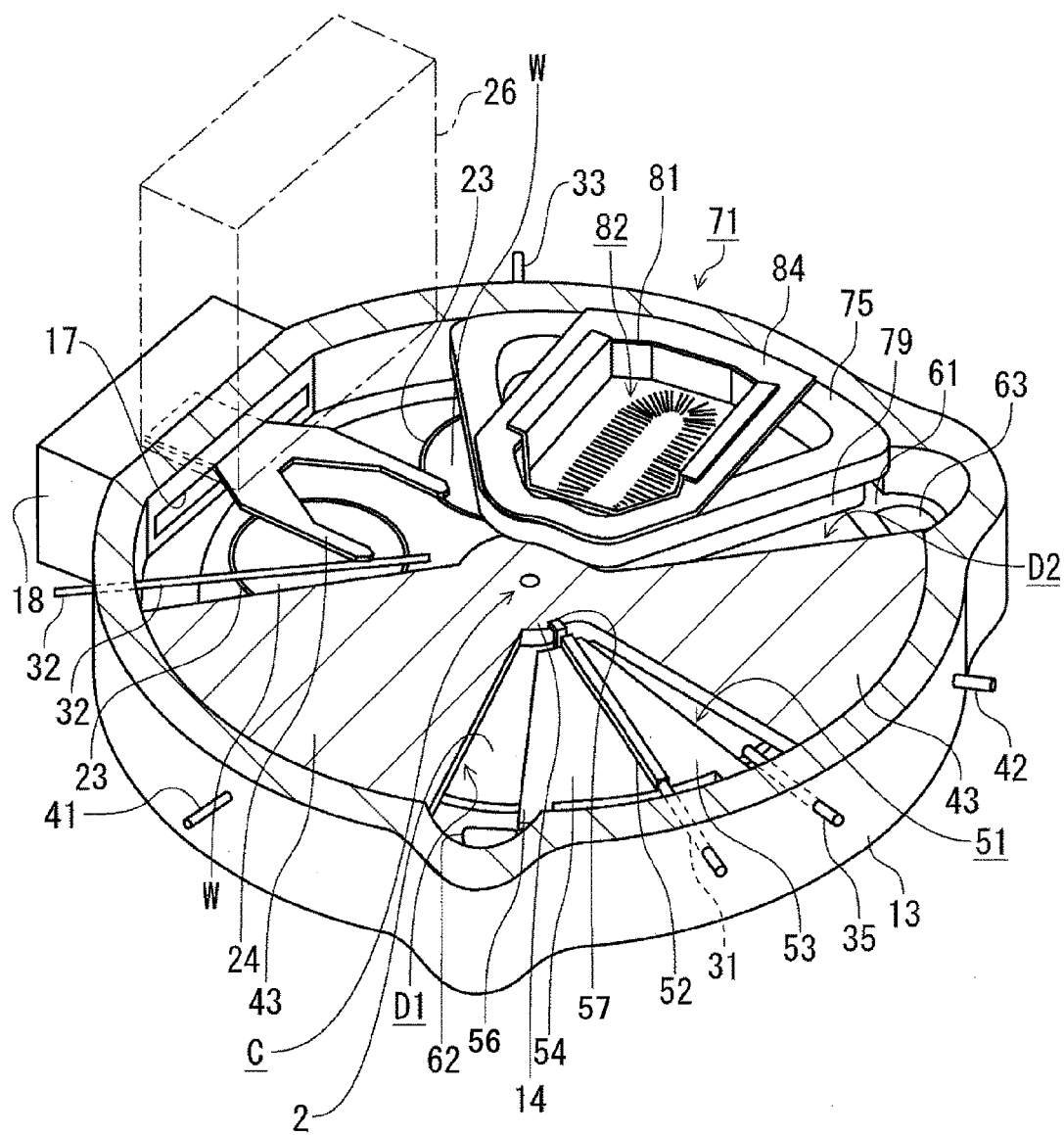
FIG. 2 is a schematic view illustrating an example of the film deposition apparatus.
Figure 3:
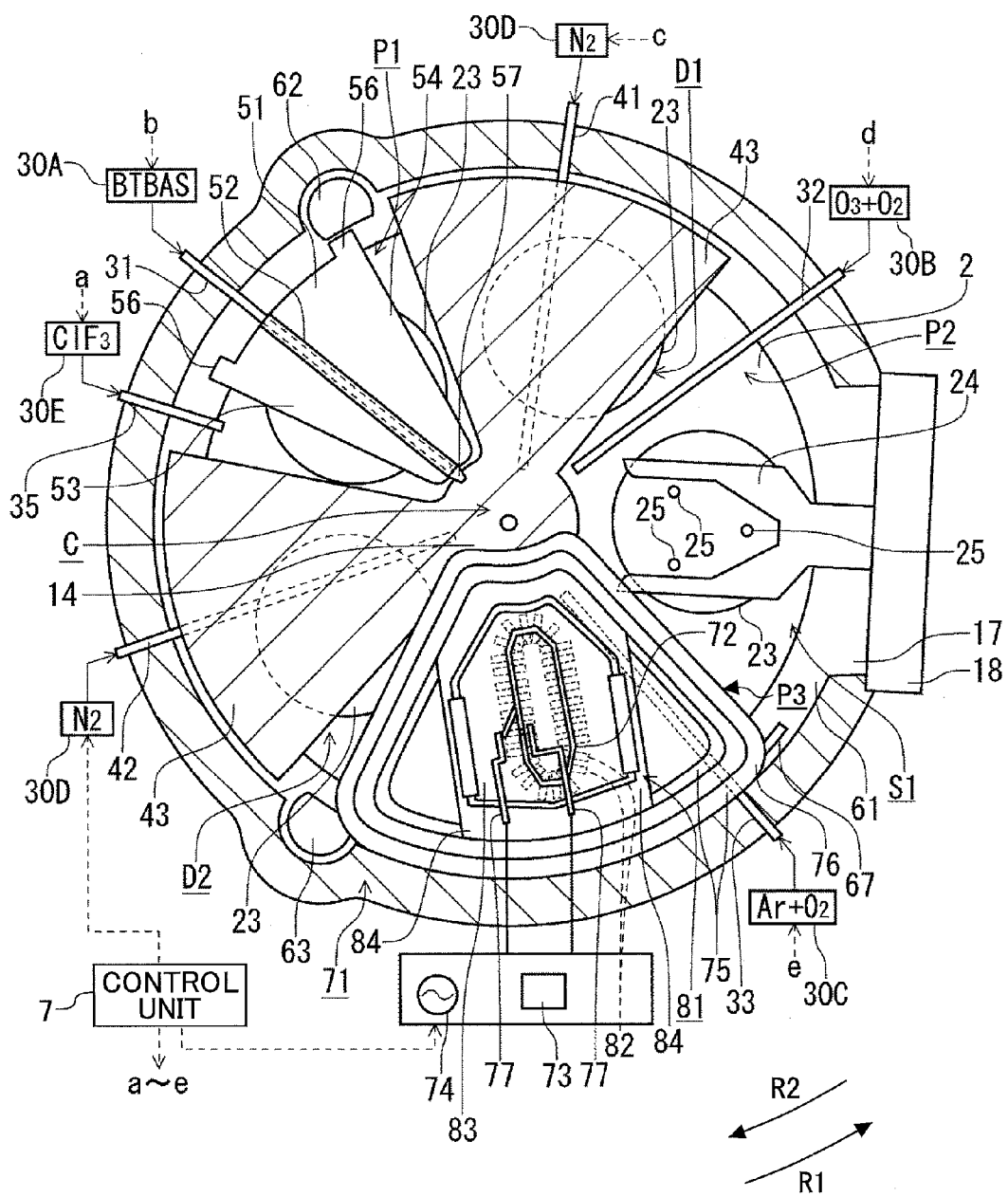
FIG. 3 is a horizontal cross-sectional view illustrating an example of the film deposition apparatus.

A film deposition apparatus 1 of the embodiment is explained with reference to FIG. 1 to FIG. 3. FIG. 1, FIG. 2 and FIG. 3 are a vertical cross-sectional side view, a schematic view and a horizontal cross-sectional view, of the film deposition apparatus 1, respectively.

The film deposition apparatus 1 includes a vacuum chamber 11 and a turntable (susceptor) 2 horizontally provided in the vacuum chamber 11. The film deposition apparatus 1 performs a film deposition process to wafers W mounted on the turntable 2 and a cleaning process to remove a film adhered to the turntable 2 during the film deposition process.

First, the film deposition process is explained. The wafers W are rotated by the turntable 2 while evacuating the vacuum chamber 11 and two kinds of reaction gasses capable of reacting with each other are alternately supplied to the wafers W to form a thin film of $SiO_2$ (silicon oxide) or the like by ALD method. Thereafter, the thin film is surface treated (modified) by applying plasma. Deposition of the thin film and the surface treatment by plasma are alternately performed when the wafers W mounted on the turntable 2 alternately pass through reaction areas, in which gasses to form the thin film are supplied, respectively, and a surface treating area by plasma. Then, a film with a desired thickness is formed on each of the wafers W.

Subsequently, the cleaning process is performed. In the cleaning process, the cleaning gas is supplied to the turntable 2 while evacuating the vacuum chamber 11 to remove the film.

Each part of the film deposition apparatus 1 is explained.

The vacuum chamber 11 is provided in the atmosphere, and inside of the vacuum chamber 11 is evacuated to be vacuum atmosphere. The vacuum chamber 11 has a substantially circular shape and includes a chamber body 13 that composes a sidewall and a bottom portion of the vacuum chamber 11 and a ceiling plate 12 made of quartz. The film deposition apparatus 1 is provided with a sealing member 11a for retaining the inside of the vacuum chamber 11 in an air-tight manner.

The ceiling plate 12 is provided with a convex portion 14 protruded downward at its center portion and forms a center portion area C including a gas passage 15 with a support portion 21 that supports the turntable 2 at the center of the vacuum chamber 11. The film deposition apparatus 1 includes a supply pipe 16 that supplies $N_2$ (nitrogen) gas, which is a purge gas, to the gas passage 15. $N_2$ gas is supplied from the gas passage 15 to a surface of the turntable 2 to prevent mixing of the different kinds of reaction gases at the center portion area C.

The turntable 2 is formed in a circular shape extending outward from the support portion 21. The turntable 2 is rotated by a rotation drive mechanism 22 provided below the support portion 21 around its center axis in a circumferential direction. The turntable 2 is provided with five concave portions 23, which are substrate mounting areas, at its front surface side along the rotation direction. The wafers W are mounted on the concave portions 23, respectively. When the turntable 2 is rotated, the wafers W mounted on the concave portions 23, respectively, are also rotated around the center axis of the turntable 2.

Five gas nozzles 31, 32, 33, 41 and 42, each being made of quartz, for example, are provided with a space therebetween in the circumferential direction of the vacuum chamber 11 at positions facing passage areas of the concave portions 23. These gas nozzles 31, 32, 33, 41 and 42 are, for example, provided to horizontally extend from the outer peripheral wall of the vacuum chamber 11 toward the center portion area C. In this example, a first reaction gas nozzle 31, a first separation gas nozzle 41, a second reaction gas nozzle 32, a gas nozzle for plasma generation 33 and a second separation gas nozzle 42 are provided in this order in a clockwise direction.

The gas nozzles 31, 32, 33, 41 and 42 are connected to gas supply sources, respectively, each provided with a flow regulation valve or the like. The first reaction gas nozzle 31 supplies a source gas that is adsorbed on the surface of the wafer W.

Specifically, the first reaction gas nozzle 31 is connected to a supply source 30A of a first reaction gas containing silicon (Si) such as Bis Tertiary-Butylamino Silane (BTBAS: $SiH_2(NHC(CH_3)_3)_2$)) gas or the like. The second reaction gas nozzle 32 supplies a gas that oxidizes or nitrizes the source gas supplied from the first reaction gas nozzle 31. Specifically, for example, the second reaction gas nozzle 32 is connected to a supply source 30B of a second reaction gas such as a mixing gas of ozone ($O_3$) gas and oxygen ($O_2$) gas. The supply source 30B may be an oxygen gas supply source provided with an ozonizer, for example.

The gas nozzle for plasma generation 33 is connected to a supply source 30C of plasma generation gas which is a mixing gas of argon (Ar) gas and oxygen gas, for example. The first separation gas nozzle 41 and the second separation gas nozzle 42 are respectively connected to gas supply sources 30D of $N_2$ gas, which is a separation gas. The gas supply sources 30A to 30C are gas supply sources to which the gas nozzles 31 to 33 are connected when the film deposition process is performed. When the cleaning process is performed, the gas nozzles 31 to 33 are also connected to the gas supply source 30D and discharge $N_2$ gas as the purge gas. With this configuration, the gas nozzles 31 to 33 can be prevented from being etched by the cleaning gas.

In this embodiment, the rotation direction of the turntable 2 is different in the film deposition process and in the cleaning process. In the film deposition process, the turntable 2 is rotated in the clockwise direction (R1, first rotational direction) and in the cleaning process, the turntable 2 is rotated in an counter-clockwise direction (R2, second rotational direction). In the following, an "upstream side in the rotational direction" and a "downstream side in the rotational direction" mean an upstream side and downstream side in the rotational direction (R1) of the film deposition process in the explanation of the film deposition apparatus 1, when not otherwise described.

The film deposition apparatus 1 is further explained with reference also to FIG. 4, which is a vertical cross-sectional side view along the rotation direction of the turntable 2.

Each of the gas nozzles 31, 32, 33, 41 and 42 is provided with a plurality of gas discharging ports 34 along a length direction of the respective gas nozzle at a lower surface side of the respective gas nozzle. The gas supplied from each of the gas supply sources 30A to 30D is discharged from the gas discharging ports 34 of the respective gas nozzle.

At the first reaction gas nozzle 31, more gas discharging ports 34 are provided at the center portion side than the outer peripheral portion side of the turntable 2 in order to prevent lowering of the concentration of the reaction gas at the center portion side due to the purge gas discharged from the center portion area C. With this configuration, the large amount of the reaction gas can be supplied at the center portion side.

The gas discharging ports 34 of the gas nozzle for plasma generation 33 are configured to discharge the gas in an inclined lower direction toward the upstream side in the rotational direction in order to prevent intrusion of the gas from the upstream side in the rotational direction to a plasma reaction area, which will be explained later.

The ceiling plate 12 of the vacuum chamber 11 is provided with two convex portions 43 protruded downward with sector shapes, respectively, wherein the convex portions 43 are formed to have spaces therebetween in the circumferential direction. The first separation gas nozzle 41 and the second separation gas nozzle 42 are recessed in the convex portions 43, respectively, to divide the respective convex portion 43 in the circumferential direction. It means that the low ceiling surfaces 44 (first ceiling surfaces), which are lower surfaces of the convex portion 43, are provided at both sides of each of the first separation gas nozzle 41 and the second separation gas nozzle 42 in the circumferential direction of the turntable 2. Then, ceiling surfaces 45 (second ceiling surfaces) which are higher than the ceiling surfaces 44 are further provided at both sides of the ceiling surfaces 44 in the circumferential direction.

Figure 5:
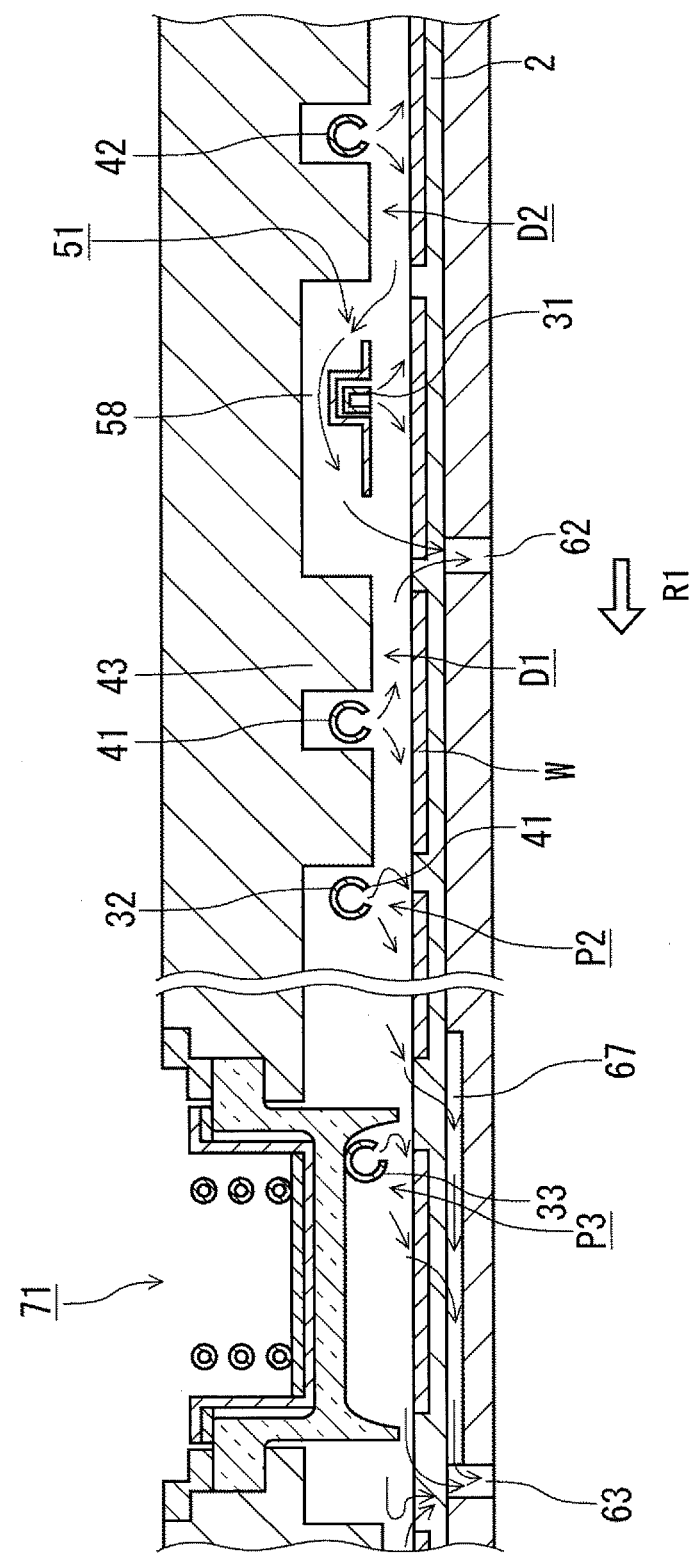
FIG. 5 is a vertical cross-sectional side view illustrating an example of the film deposition apparatus.

Separation areas are provided below the first ceiling surfaces 44, respectively, for preventing the mixing of the first reaction gas and the second reaction gas. Hereinafter, the separation areas where the first separation gas nozzle 41 and the second separation gas nozzle 42 are provided are referred to as separation areas D1 and D2, respectively. $N_2$ gas (separation gas) provided to the separation areas D1 and D2 from the first separation gas nozzle 41 and the second separation gas nozzle 42, respectively, at the film deposition process spread in the separation areas D1 and D2 in the circumferential direction to flow away the first and second reaction gasses and the plasma generation gas to a first vacuum evacuation port 62 and a second vacuum evacuation port 63, which will be explained later. FIG. 5 illustrates gas flows at the film deposition process with arrows.

Figure 6:
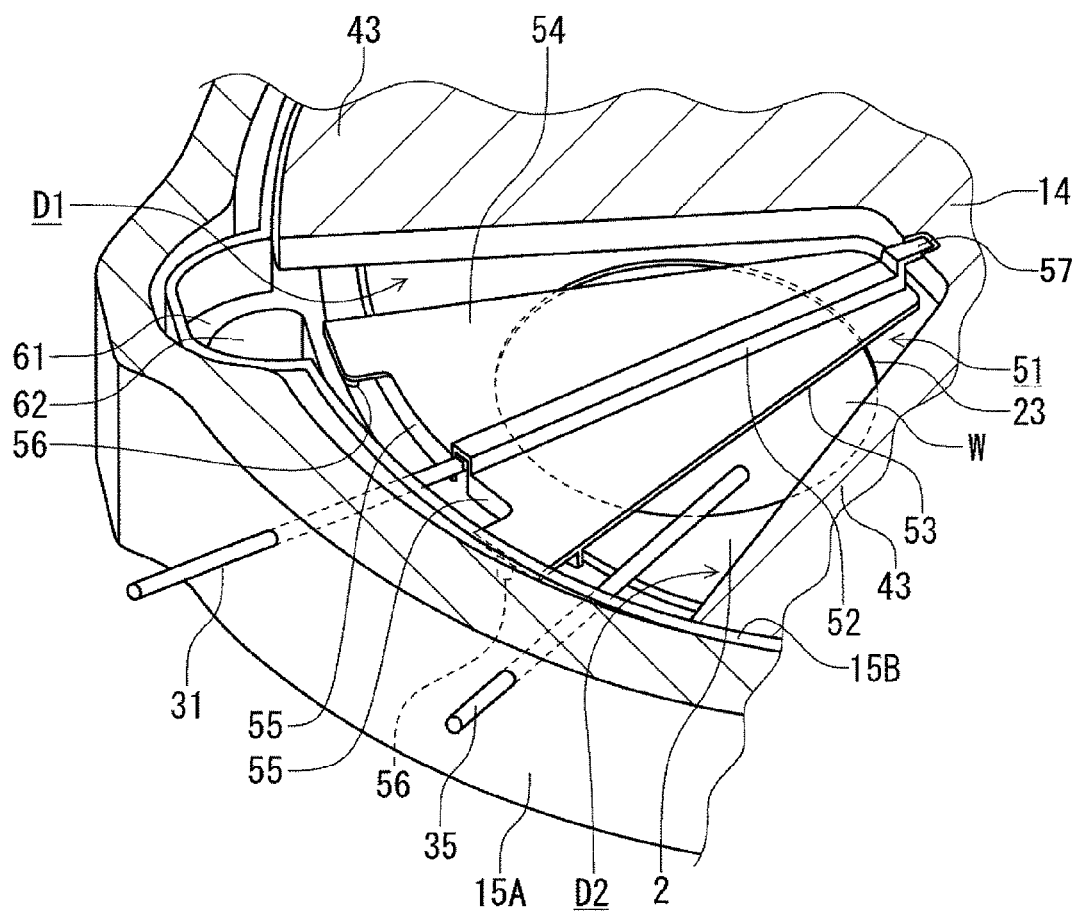
FIG. 6 is a perspective view illustrating a nozzle cover of a first reaction gas nozzle of the film deposition apparatus.

Further, a nozzle cover 51 that covers the first reaction gas nozzle 31 in the length direction of the first reaction gas nozzle 31 is provided, as shown in FIG. 6. The nozzle cover 51 is made of quartz. The first reaction gas nozzle 31 is formed to have a rectangular cross sectional view at a portion where the gas discharging ports 34 are provided. The nozzle cover 51 includes a cover body 52 that covers the upper side and the both sides of the rectangular shaped portion of the first reaction gas nozzle 31 and the center side of the turntable 2 and horizontal flow regulating plates 53 and 54 protruded from the lower end of the cover body 52 toward the upstream side and the downstream side in the rotational direction, respectively. The height "h1" of the flow regulating plates 53 and 54 from the turntable 2 shown in FIG. 4 is, for example, about 0.5 to 3 mm. The flow regulating plates 53 and 54 are formed to protrude larger as closer to the outside of the turntable 2 so that the nozzle cover 51 is formed to have a substantially sector top view. The flow regulating plates 53 and 54 are bent downward at the outer peripheral side of the turntable 2 to form a facing portion 55 that faces the outer peripheral side of the turntable 2. The nozzle cover 51 includes support portions 56 and 57 that support the nozzle cover 51 with respect to a bottom portion of the vacuum chamber 11 and the center portion area C of the film deposition apparatus 1, respectively.

The flow regulating plates 53 and 54 have a function to flow the first reaction gas supplied from the first reaction gas nozzle 31 along the wafer W and to increase reactivity between the wafer W and the first reaction gas. The lower area of the first reaction gas nozzle 31 and these flow regulating plates 53 and 54 becomes a first reaction area P1 for adsorbing the first reaction gas onto the wafer W. The flow regulating plate 53 has a function to guide the separation gas, flowing from the second separation gas nozzle 42 to the first reaction area P1, toward a passage space 58 above the nozzle cover 51 and prevent entering of the separation gas to the first reaction area P1 (see FIG. 4 and FIG. 5). With this configuration, lowering of the concentration of the first reaction gas in the first reaction area P1 can be suppressed. The height "h2" of the passage space 58 shown in FIG. 4 is, for example, about 5 to 15 mm.

A wall portion of the cover body 52 at the center side of the turntable 2 and the facing portion 55 have a function to prevent the flowing of the first reaction gas supplied to the first reaction area P1 toward the peripheral of the turntable 2 by the purge gas supplied from the center portion area C toward the peripheral of the turntable 2. With this configuration, uniformity in the concentration of the first reaction gas in the radial direction of the turntable 2 can be increased.

Figure 7:
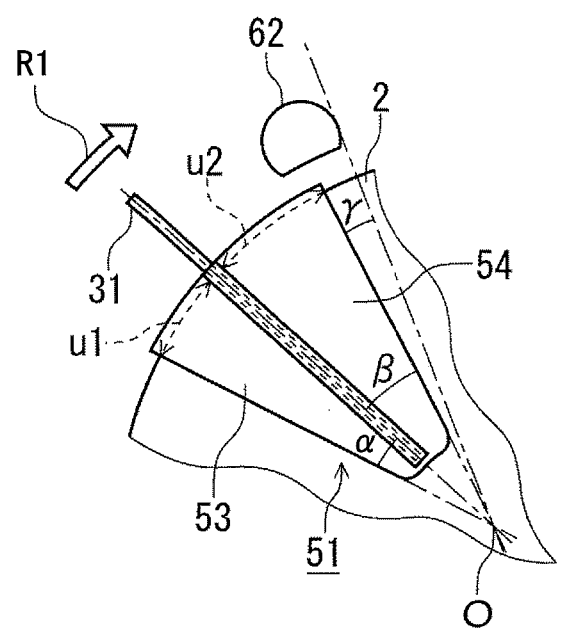
FIG. 7 is a plan view illustrating the nozzle cover.

An example of the size of the nozzle cover 51 is explained with reference to FIG. 7 which is a plan view illustrating the nozzle cover 51.

In this embodiment, the flow regulating plate is formed longer at the downstream side than at the upstream side in the rotation direction (R1), in the circumferential direction. Specifically, an angle α between an outer shape line of the flow regulating plate 53 at the upstream side in the rotational direction and the first reaction gas nozzle 31 is 15°, for example. An angle β between an outer shape line of the flow regulating plate 54 at the downstream side in the rotational direction and the first reaction gas nozzle 31 is larger than angle α, and is 22.5°, for example. Arc lengths u1 and u2 of the flow regulating plates 53 and 54 above the outer peripheral portion of the turntable 2 are 120 mm and 180 mm, for example, respectively.

An angle γ between a line bonding the center O of the turntable 2 and an end portion of the first vacuum evacuation port 62 at the downstream side in the rotational direction (shown as a chain line) and the outer shape line of the flow regulating plate 54 at the downstream side in the rotational direction is set to be greater than or equal to 0°, and is 7.5°, for example. It means that the first vacuum evacuation port 62 is provided at the first separation area D1 side than the nozzle cover 51 that forms the first reaction gas supplying area. With this configuration, the flow of the first reaction gas from the first reaction gas nozzle 31 toward the first vacuum evacuation port 62 is not prevented by the flow regulating plate 54.

As shown in FIG. 2 or FIG. 3, for example, the film deposition apparatus 1 includes a plasma processing unit 71 provided to the vacuum chamber 11. The plasma processing unit 71 is explained. As shown in FIG. 3, the plasma processing unit 71 is provided to overlap the passage area of the wafers W from the center portion side to the outer peripheral portion side of the turntable 2, seen in a plan view. In the following, FIG. 8, which is an exploded perspective view of the plasma processing unit 71, is also referred to.

The plasma processing unit 71 includes an antenna 72 made of a metal wire wound in a coil shape. The antenna 72 is formed to have a substantially octagonal shape such as surrounding a band-shaped region extending along the radial direction of the turntable 2. The antenna 72 is connected to a high frequency power source 74 whose frequency is 13.56 MHz and output power is 5000 W, for example, via a matching box 73.

The ceiling plate 12 is provided with an opening portion having a substantially sector top view shape above the gas nozzle for plasma generation 33. The opening portion is blocked by a housing 75 made of quartz or the like, for example, in an air-tight manner so that the antenna 72 is separated from the inside of the vacuum chamber 11 in an air-tight manner. The housing 75 is formed such that a peripheral portion horizontally protrudes in the circumferential direction like a flange, and a center portion concaves toward an inner area of the vacuum chamber 11. The antenna 72 is housed in the inside of the housing 75. A pushing member 76 pushes the peripheral portion of the housing 75 toward a lower side. The plasma processing unit 71, the matching box 73 and the high frequency power source 74 are electrically connected via a connecting electrode 77.

The housing 75 is provided with a protruding portion 79 at its outer peripheral and lower portion where the outer end portion protrudes downward (the turntable 2 side) along the circumferential direction for gas flow regulation in order to prevent the intrusion of the separation gas and the second reaction gas to the lower area of the housing 75. The gas nozzle for plasma generation 33 is housed within an area surrounded by an inner peripheral surface of the protruding portion 79 and the lower surface of the housing 75. The area surrounded by the protruding portion 79 forms a plasma reaction area P3, which is the surface treating area.

Figure 8:
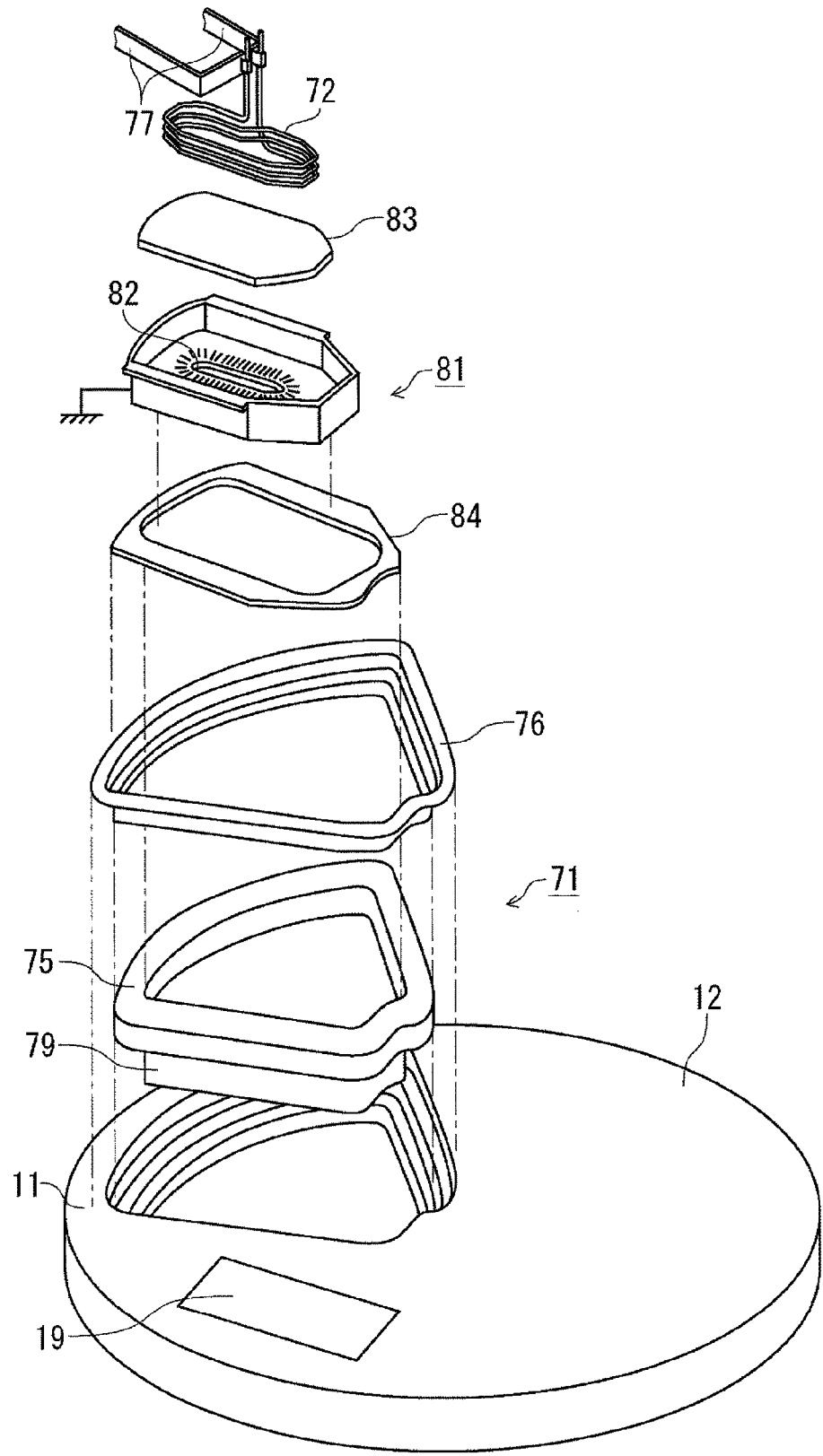
FIG. 8 is an exploded perspective view of a plasma processing unit of the film deposition apparatus.

There is provided a Faraday shield 81 having a substantially box shape opened at an upper surface side between the housing 75 and the antenna 72. The Faraday shield 81 is made by a metal plate, which is a conductive plate, and is grounded. The Faraday shield 81 is provided with a plurality of slits 82 at its bottom surface. With this configuration, the electric field component is prevented from flowing downward at the wafer W and the magnetic field component can reach the wafer W, among the electric field component and the magnetic field component generated by the antenna 72 (electromagnetic field component). The slits 82 are formed to extend in a direction perpendicular to the wound direction of the antenna 72 below the antenna 72 along the antenna 72 in the circumferential direction. As shown in FIG. 8, an insulating plate that insulates the Faraday shield 81 and the antenna 72, and a support member for supporting the Faraday shield 81 to the flange of the housing 75 are provided.

Subsequently, the rest of the parts of the vacuum chamber 11 are explained. As shown in FIGS. 1, 3 and 6 or the like, a ring member 61 is provided below the turntable 2 at an outer peripheral side of the turntable 2 along the peripheral of the vacuum chamber 11. The ring member 61 protects a sidewall of the vacuum chamber 11 from the cleaning gas. As shown in FIG. 6, actually, the sidewall of the vacuum chamber 11 includes an outside wall 15A and an inside wall 15B that protects the outside wall 15A from the cleaning gas. However, the outside wall 15A and the inside wall 15B are integrally depicted in order to simplify the explanation in other drawings.

The ring member 61 is provided with the first vacuum evacuation port 62 and the second vacuum evacuation port 63 which are apart from each other in the circumferential direction. As described above, the end portion of the first vacuum evacuation port 62 at the downstream side is provided closer to at the first separation area D1 side than the nozzle cover 51 in the rotation direction (R1). The second vacuum evacuation port 63 is provided closer to at the second separation area D2 side than the plasma reaction area P3. The first vacuum evacuation port 62 evacuates the first reaction gas and the separation gas while the second vacuum evacuation port 63 evacuates the second reaction gas, the plasma generation gas and the separation gas. The first reaction gas and the second reaction gas are mainly evacuated by the first vacuum evacuation port 62 and the second vacuum evacuation port 63, respectively.

Each of the first vacuum evacuation port 62 and the second vacuum evacuation port 63 is connected to a vacuum pump 65 which is a vacuum evacuation mechanism via an evacuation pipe 64. A pressure regulator 66 such as a butterfly valve is provided to the evacuation pipe 64. The evacuation amount of the first vacuum evacuation port 62 and the second vacuum evacuation port 63 can be independently controlled.

Figure 4:
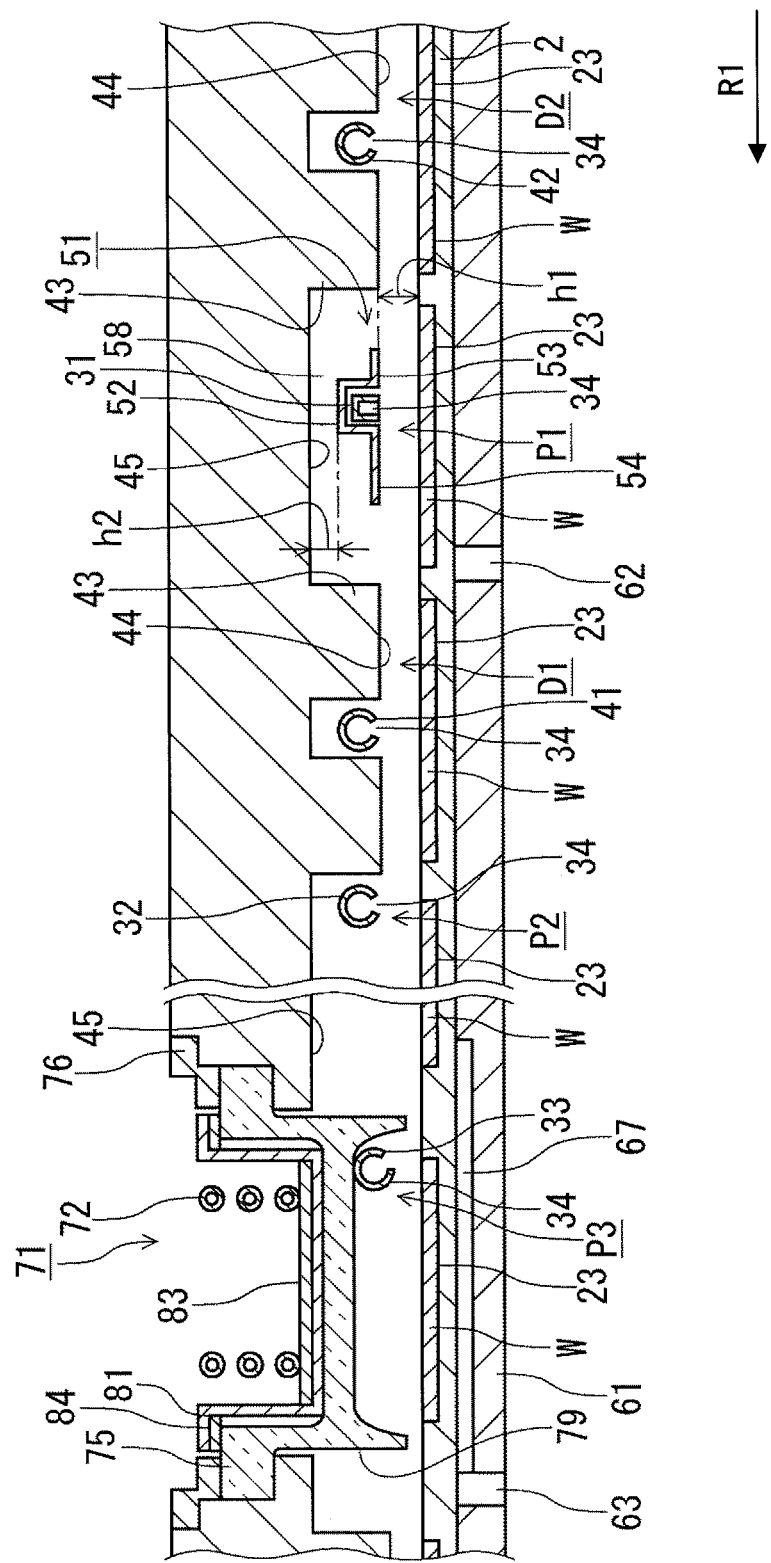
FIG. 4 is a vertical cross-sectional side view illustrating an example of the film deposition apparatus.

As shown in FIG. 3 and FIG. 4, the ring member 61 is provided with a groove 67 extending from the second vacuum evacuation port 63 toward the upstream side of the plasma processing unit 71 in the rotational direction, in the circumferential direction. The groove 67 guides the separation gas supplied from the first separation gas nozzle 41 and the second reaction gas supplied from the second reaction gas nozzle 32 to the second vacuum evacuation port 63.

The lower area of the second reaction gas nozzle 32, to which the second reaction gas is provided, becomes a second reaction area P2 for reacting the first reaction gas adsorbed onto the wafer W and the second reaction gas.

A space between the downstream side of the second reaction area P2 and the upstream side of the plasma processing unit 71, in the rotational direction, becomes a passing area S1 of the wafer W. The vacuum chamber 11 is provided with a transfer port 17 of the wafer W at its sidewall to face the passing area S1. The transfer port 17 is capable of being opened and closed by a gate valve 18 and a transferring mechanism 24 that transfers the wafer W is capable of being introduced in and out of the vacuum chamber 11. Although not illustrated in the drawings, there are provided lift pins below the turntable 2 at the passing area S1. The lift pins are elevated from the surface of the turntable 2 via through holes 25 provided in the concave portion 23 of the turntable 2 to pass the wafer W between the concave portion 23 and the transferring mechanism 24.

A monitor 26 composed of a CCD camera is provided above the passing area S1 at the outside of the vacuum chamber 11. The ceiling plate 12 is provided with a detection window 19, made of quartz, for example, above the passing area S1. The monitor 26 captures an image of the wafer W transferred by the transferring mechanism 24 to the vacuum chamber 11 via the detection window 19. Thus, the user of the film deposition apparatus 1 can know whether the passing of the wafer W is properly performed at the passing area S1.

A cleaning gas nozzle 35 which is a cleaning gas supplying portion is provided at the upstream side of the nozzle cover 51 and the downstream side of the second separation area D2, in the rotational direction. The cleaning gas nozzle 35 is formed to have a stick shape extending from the outer peripheral of the turntable 2 to the peripheral end portion of the vacuum chamber 11. The cleaning gas nozzle 35 is connected to a gas supply source 30E, similarly as the other gas nozzles. The cleaning gas of fluorine containing gas such as $ClF_3$ or the like, for example, is provided to the cleaning gas nozzle 35 from the gas supply source 30E, and is discharged from a front end portion of the cleaning gas nozzle 35 toward the center portion side of the turntable 2.

As explained in the background, when the cleaning gas is supplied to the passing area S1, the detection window 19 is fogged or shaded or by the cleaning gas. Thus, there is a possibility that the detection of the wafer W cannot be performed. Therefore, the cleaning gas nozzle 35 is provided not to supply the cleaning gas to the passing area S1. In this example, the cleaning gas nozzle 35 is provided to be closer to the first vacuum evacuation port 62 than to the second vacuum evacuation port 63 in the rotation direction (R1). The cleaning gas nozzle 35 detachably attached to the vacuum chamber 11 and may be detached when the film deposition process is performed, for example.

As shown in FIG. 1, a heater 27 is provided below the turntable 2 with spaced apart from the turntable 2. The turntable 2 is heated by the radiation heat from the heater 27 toward the turntable 2 and the mounted wafers W are heated. The chamber body 13 is provided with a purge gas supply pipe 28 for purging a space in which the heater 27 is provided by $N_2$ gas. A case body 20 that covers the center bottom of the vacuum chamber 11 is provided with a purge gas supplying portion 29 that supplies $N_2$ gas as the purge gas from the lower center portion of the turntable 2 to the peripheral portion.

The film deposition apparatus 1 includes a control unit 7 composed of a computer for controlling the entirety of the operation of the apparatus. The control unit 7 stores a program to execute the film deposition process and the cleaning process, as will be explained later. This program controls operations of units of the film deposition apparatus 1 by sending a control signal to each of the units. Specifically, the control unit 7 controls supplying and terminating of the gas from each of the gas supply sources 30A to 30E to the respective gas nozzle, plasma generation or termination by switching on and off the high frequency power source 74, rotation speed of the turntable 2 by the rotation drive mechanism 22, adjusting of the evacuation amounts from the first vacuum evacuation port 62 and the second vacuum evacuation port 63 by the pressure regulator 66 or the like. The program is formed to include steps capable of executing the operations of the units of the film deposition apparatus 1. The program is installed from a recording medium such as a hard disk, a compact disk (CD), a magneto-optic disk, a memory card, a flexible disk, or the like to the control unit 7.

Then, a process of performing the film deposition process on the wafer W by the film deposition apparatus 1 is explained.

First, the turntable 2 is intermittently rotated while the gate valve 18 is opened, and the wafers W are transferred by the transferring mechanism 24 via the transfer port 17 to the passing area S1 and mounted on the five concave portions 23 of the turntable 2, respectively. Then, the vacuum chamber 11 is evacuated to ultimate pressure by the vacuum pump 65 via the first vacuum evacuation port 62 and the second vacuum evacuation port 63. Meanwhile, the turntable 2 is rotated by the rotation drive mechanism 22 at about, for example, 2 rpm to 240 rpm in the clockwise direction (R1) and the wafers W are heated by the heater 27 to, for example, 300° C.

Subsequently, BTBAS gas, which is the first reaction gas, is supplied from the first reaction gas nozzle 31, and $O_3$ gas and $O_2$ gas, which are the second reaction gas, are supplied from the second reaction gas nozzle 32. At the same time, Ar gas and $O_2$ gas, which are the plasma generation gas, are supplied from the gas nozzle for plasma generation 33. Further, while supplying $N_2$ gas, which is the separation gas, from the first separation gas nozzle 41 and the second separation gas nozzle 42, $N_2$ gas, which is the purge gas, is supplied from the center portion area C, the purge gas supply pipe 28 and the purge gas supplying portion 29, respectively. The flow rate of $N_2$ gas supplied from the first separation gas nozzle 41 and the second separation gas nozzle 42, respectively, is 3 to 10 L/minutes, for example. Then, the evacuation amounts from the first vacuum evacuation port 62 and the second vacuum evacuation port 63 are controlled by the pressure regulator 66 so that the process pressure in the vacuum chamber 11 is adjusted to a predetermined pressure and the high frequency power is supplied to the antenna 72.

The first reaction gas is adsorbed onto the surface of the wafer W at the first reaction area P1 and the first reaction gas adsorbed onto the surface of the wafer W reacts with the second reaction gas at the second reaction area P2, by the rotation of the turntable 2, so that a single or a plurality of molecular layer(s) of $SiO_2$ is formed as a reaction product. At this time, impurities such as water (OH), an organic compound or the like may be included in the reaction product due to the residual component included in the first reaction gas, for example.

Meanwhile, below the plasma processing unit 71, the electric field component among the electric field component and the magnetic field component generated by the high frequency power supplied from the high frequency power source 74 is reflected or absorbed (attenuated) by the Faraday shield 81 and is prevented from reaching in the vacuum chamber 11. The magnetic field component reaches in the vacuum chamber 11 through the slits of the Faraday shield 81 and the bottom surface of the housing 75. Thus, the plasma generation gas supplied from the gas nozzle for plasma generation 33 is activated by the magnetic field component which has reached through the slits 82 to generate plasma such as ion, radical or the like.

When the plasma (active species) generated by the magnetic field component contacts the surface of the wafer W, the surface treatment of the reaction product is performed. Specifically, when the plasma collides against the surface of the wafer W, the impurities are discharged from the reaction product or the elements in the reaction product are rearranged to be a dense (to have high density) reaction product, for example. By continuing rotation of the turntable 2 as such, adsorption of the first reaction gas onto the surface of the wafer W, reaction of the first reaction gas adsorbed onto the surface of the wafer W, and the surface treatment of the reaction product are repeated in this order so that a molecular layer(s) of $SiO_2$ is deposited.

Figure 9:
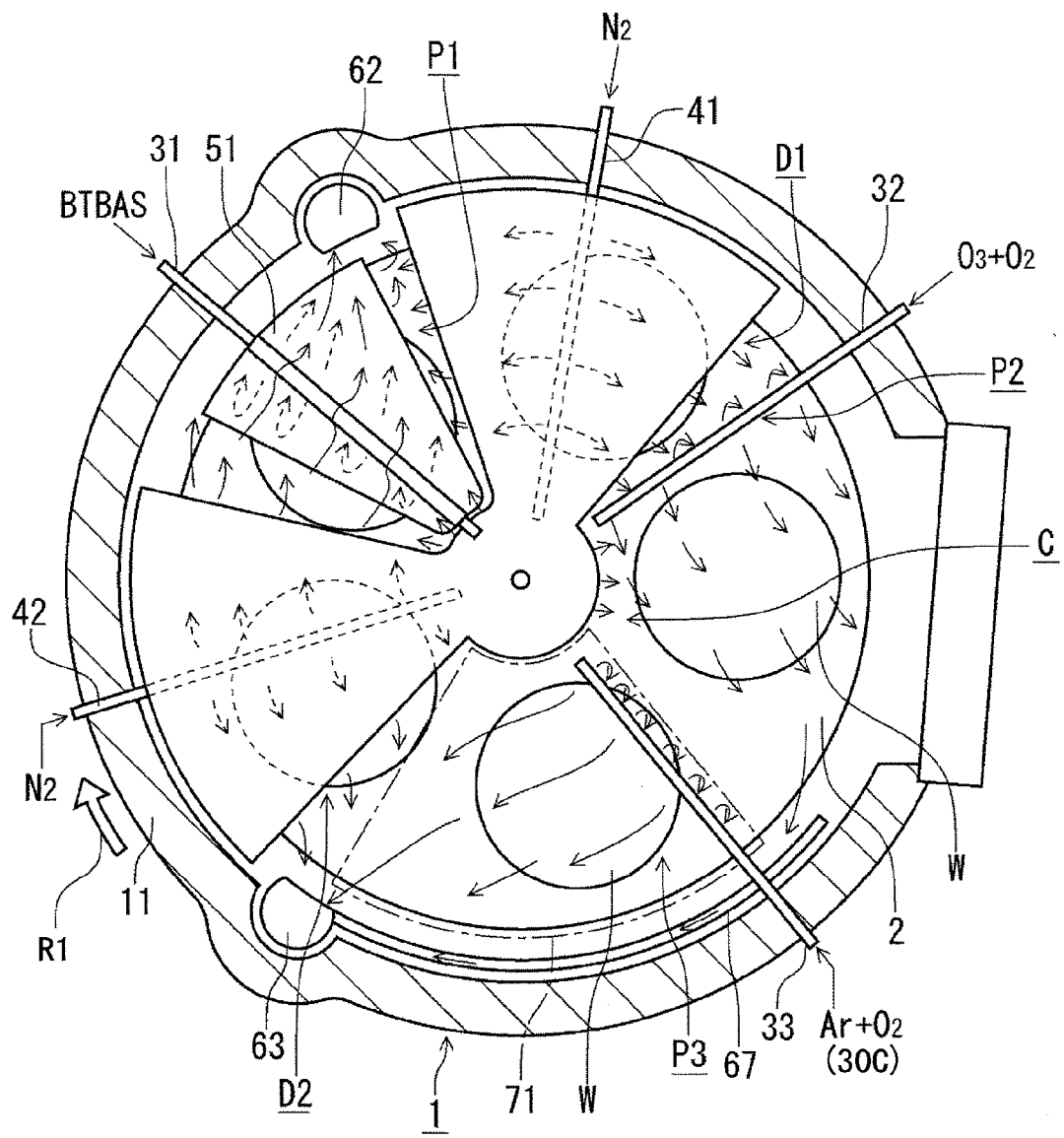
FIG. 9 is a view for explaining a gas flow at a film deposition process.

FIG. 9 is a plan view illustrating the vacuum chamber 11 and illustrates gas flows at the film deposition process, similarly as FIG. 5. As shown in FIG. 5 and FIG. 9, as the separation gas is supplied to the first separation area D1 and the second separation area D2 between the first reaction area P1 and the second reaction area P2, the gasses are evacuated such that the mixing of the first reaction gas, the second reaction gas and the plasma generation gas can be prevented. Further, as the purge gas is supplied to the lower side of the turntable 2, the gas that tends to be dispersed toward the lower side of the turntable 2 is pushed back toward the first vacuum evacuation port 62 and the second vacuum evacuation port 63 by the purge gas. Further, as described above, the separation gas flowing from the first separation gas nozzle 41 toward the first reaction area P1 flows above the nozzle cover 51 and is evacuated toward the first vacuum evacuation port 62 from the upper side of the nozzle cover 51. When the turntable 2 is rotated for a predetermined time and $SiO_2$ film with a desired thickness is formed, supplying of the gasses are terminated and the wafers W are carried out from the film deposition apparatus 1 by an operation opposite from those performed when carrying in the wafers W.

Subsequently, the cleaning process is explained.

In the following, the "upstream side" and the "downstream side" in the rotational direction means the upstream side and the downstream side in the rotation direction (R2) at the cleaning process.

The cleaning gas nozzle 35 is attached to the vacuum chamber 11. The connections between the gas nozzles 31 to 33 and the supply source 30A to 30C of the reaction gasses and the plasma generation gas are shut, and instead, the gas nozzles 31 to 33 are connected to the $N_2$ gas supply source 30D. The evacuation from the first vacuum evacuation port 62 is terminated and the second vacuum evacuation port 62 is evacuated at a predetermined amount. At the same time, the turntable 2 is heated to, for example, 550° C. by the heater 27 while rotating the turntable 2 at 5 rpm by the rotation drive mechanism 22 in the counter-clockwise direction, for example. Then, the separation gas is supplied from the first separation gas nozzle 41 and the second separation gas nozzle 42 and the purge gas is supplied from the gas nozzles 31 to 33, the center portion area C, the purge gas supply pipe 28 and the purge gas supplying portion 29, respectively. The flow rate of the separation gas supplied from the first separation gas nozzle 41 is, for example, 3 to 10 L/minutes, which is the same as that at the film deposition process. The flow rate of the separation gas supplied from the second separation gas nozzle 42 is 3 to 10 L/minutes, which is the same as that at the film deposition process in this case. With the supplying of the separation gas and the purge gas, the cleaning gas is supplied from the cleaning gas nozzle 35.

Figure 10:
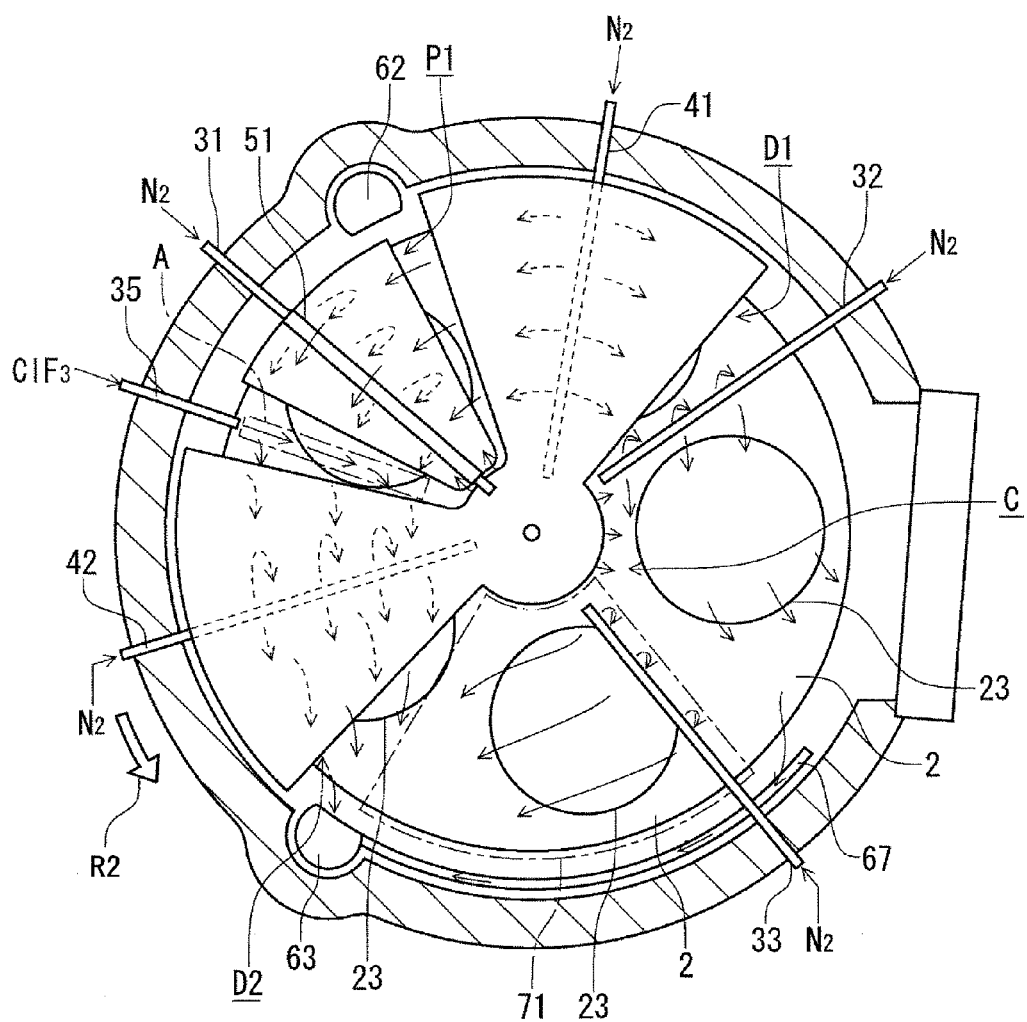
FIG. 10 is a view for explaining a gas flow at a cleaning process.

FIG. 10 is a view for explaining gas flows at the cleaning process. The cleaning gas is supplied toward the center portion of the turntable 2 while etching $SiO_2$ film adhered to the turntable 2. Meanwhile, the separation gas supplied to the first separation area D1 flows over the nozzle cover 51 toward the cleaning gas supplying area A by the evacuation from the second vacuum evacuation port 63. The purge gas supplied from the first reaction gas nozzle 31 flows similarly toward the cleaning gas supplying area A. As such, the cleaning gas supplied on the turntable 2 flows toward the second vacuum evacuation port 63. It means that the flow of the cleaning gas toward the nozzle cover 51, the upstream side in the rotation direction (R2) can be suppressed. This is because the cleaning gas is pushed by $N_2$ gas, which is the purge gas and the separation gas flowing toward the cleaning gas supplying area A, to the downstream side of the rotation direction (R2), the evacuation is performed only from the second vacuum evacuation port 63, among the first vacuum evacuation port 62 and the second vacuum evacuation port 63, and the turntable 2 is rotated from the cleaning gas supplying area A toward the vacuum evacuation port 63.

The cleaning gas and $N_2$ gas that pushes the cleaning gas pass the second separation area D2 at which the second separation gas nozzle 42 is provided, meet the separation gas supplied to the second separation area D2, further flow toward the downstream side in the rotational direction and are evacuated from the second vacuum evacuation port 63. The separation gas flows from the first separation gas nozzle 41 in the separation area D1 toward the upstream side in the rotational direction meets the purge gas supplied from the second reaction gas nozzle 32 and the purge gas supplied from the gas nozzle for plasma generation 33 and is removed from the second vacuum evacuation port 63 with the cleaning gas.

A mechanism when the evacuation from the first vacuum evacuation port 62 is terminated, is explained.

In this embodiment, as the cleaning gas nozzle 35 is closer to the first vacuum evacuation port 62 than to the second vacuum evacuation port 63, when the evacuation is performed from the first vacuum evacuation port 62 at the cleaning process, most of the cleaning gas supplied from the cleaning gas nozzle 35 flows toward the first vacuum evacuation port 62. There is provided the nozzle cover 51 on a path from the cleaning gas nozzle 35 to the first vacuum evacuation port 62 and if the cleaning gas flows toward the first vacuum evacuation port 62, the cleaning gas flows above the nozzle cover 51 with the $N_2$ gas supplied from the second separation gas nozzle 42 toward the first vacuum evacuation port 62. Thus, the contacting period with the turntable 2 becomes relatively small. Further, there is a possibility that the nozzle cover 51 is etched.

However, in this embodiment, by terminating the evacuation of the first vacuum evacuation port 62, flowing of the cleaning gas above the nozzle cover 51 can be prevented and lowering of the contacting period of the cleaning gas with the turntable 2 can be prevented. Further, etching of the nozzle cover 51 can be prevented.

Referring back to the explanation of the cleaning process, when the rotation of the turntable 2 is continued, the cleaning gas supplied from the cleaning gas nozzle 35 spreads in the circumferential direction of the turntable 2, the cleaning gas is supplied to the entirety of the turntable 2 and $SiO_2$ is removed at the entirety of the turntable 2. Supplying of the gasses are terminated to terminate the cleaning process when a predetermined period has passed after starting the supplying of the cleaning gas. Thereafter, the gas nozzles 31 to 33 are connected to the gas supply sources 30A to 30C, respectively, and the film deposition process is started again.

As described above, by performing the cleaning process after terminating the evacuation from the first vacuum evacuation port 62 in the film deposition apparatus 1, flowing of the cleaning gas toward the first reaction gas nozzle 31 can be prevented and thus, the nozzle cover 51 and contacting of the cleaning gas with the first reaction gas nozzle 31 and the nozzle cover 51 can be prevented. Further, the time necessary for the cleaning process can be shortened and the lowering of the concentration (or flow rate) of the cleaning gas can be prevented. As a result, productivity of the film deposition apparatus 1 can be improved and the operating cost for the apparatus can be reduced as the amount of the used cleaning gas can be lowered. Further, as the etching of the nozzle cover 51 by the cleaning gas is suppressed, the phenomenon that the space between the flow regulating plates 53 and 54 and the turntable 2 becomes large can be suppressed. With this, ununiformity in the thickness of a film between wafers W or within a single wafer W or lowering of the deposited amount of the Si compound, which is BTBAS gas, onto the wafer W can be prevented. Further, it is unnecessary to change the nozzle cover 51 so often so that the productivity of the film deposition apparatus 1 can be increased and the operating cost can be reduced in this point as well. Further, in this example, the cleaning gas is evacuated toward the second vacuum evacuation port 63, which is further than to the first vacuum evacuation port 62. Thus, the contacting time of the cleaning gas with the turntable 2 can be extended in this point as well so that the cleaning time can be shortened and the lowering of the concentration (or flow rate) of the cleaning gas can be prevented.

There is a possibility that the ceiling surface 44 of the second separation area D2 is etched when the cleaning gas passes through the second separation area D2. However, even when the distance between the ceiling surface 44 and the turntable 2 becomes large, there is not a big influence on the function to separate the first reaction gas and the second reaction gas. It means that etching of the ceiling surface 44 causes less influence on the film deposition process, compared with the etching of the nozzle cover 51, the cleaning process of the embodiment is effective.

In the above example, the flow rate of $N_2$ gas from the second separation gas nozzle 42 at the cleaning process is almost the same as that at the film deposition process. Alternatively, the flow rate of $N_2$ gas at the cleaning process may be smaller than that at the film deposition process, and may be 0.5 L/minutes to 5 L/minutes, for example. With this, the amount of $N_2$ gas flowing from the second separation gas nozzle 42 toward the cleaning gas supplying area A becomes small so that the concentration of the cleaning gas in the cleaning gas supplying area A can be kept high to effectively perform the cleaning process.

In the above example, at the cleaning process, the turntable 2 is rotated in the direction opposite to that at the film deposition process. With this, the cleaning gas is surely prevented from flowing toward the nozzle cover 51. However, alternatively, the turntable 2 may be rotated in the same direction as that at the film deposition process.

Further, a cleaning process (second cleaning process) to remove Si compound by BTBAS gas adhered to the first reaction gas nozzle 31 and the nozzle cover 51 may be performed after or before performing the above cleaning process (first cleaning process) to clean the turntable 2, as the cleaning process. In the second cleaning process, the evacuation is performed both from the first vacuum evacuation port 62 and the second vacuum evacuation port 63 and the turntable 2 is rotated in the clockwise direction (R1) as same as that at the film deposition process. Then, the turntable 2 is heated similarly as the first cleaning process, $N_2$ gas is supplied from the second reaction gas nozzle 32, the gas nozzle for plasma generation 33, the first separation gas nozzle 41, the second separation gas nozzle 42, the center portion area C, the purge gas supply pipe 28 and the purge gas supplying portion 29, respectively, and the cleaning gas is supplied from the cleaning gas nozzle 35. Supplying of the gas from the first reaction gas nozzle 31 is kept terminated. Alternatively, a small amount of $N_2$ gas, about 0.05 L/minutes to 0.5 L/minutes, may be supplied from the first reaction gas nozzle 31. With this operation, etching of the gas discharging ports 34 provided at the first reaction gas nozzle 31 by the cleaning gas or flowing of the gas including the residue of cleaned $SiO_2$ film into the gas discharging ports 34 can be prevented.

As the evacuation is performed from the first vacuum evacuation port 62, and the turntable 2 is rotated in the direction from the cleaning gas nozzle 35 toward the nozzle cover 51, the cleaning gas flows toward the nozzle cover 51. A part of the cleaning gas flows above the nozzle cover 51 to be evacuated from the first vacuum evacuation port 62 and another part of the cleaning gas flows below the nozzle cover 51 to be evacuated from the first vacuum evacuation port 62. With this, Si compound adhered to the nozzle cover 51 and the first reaction gas nozzle 31 is etched and removed from the first vacuum evacuation port 62. The gasses supplied from the other gas nozzles, the center portion area C or the like are evacuated from the first vacuum evacuation port 62 and the second vacuum evacuation port 63, similarly at the film deposition process. As Si compound is etched more easily than $SiO_2$ film adhered to the turntable 2, the time required for the second cleaning process is a relatively short.

Other examples of the film deposition apparatus are explained.

Figure 11:
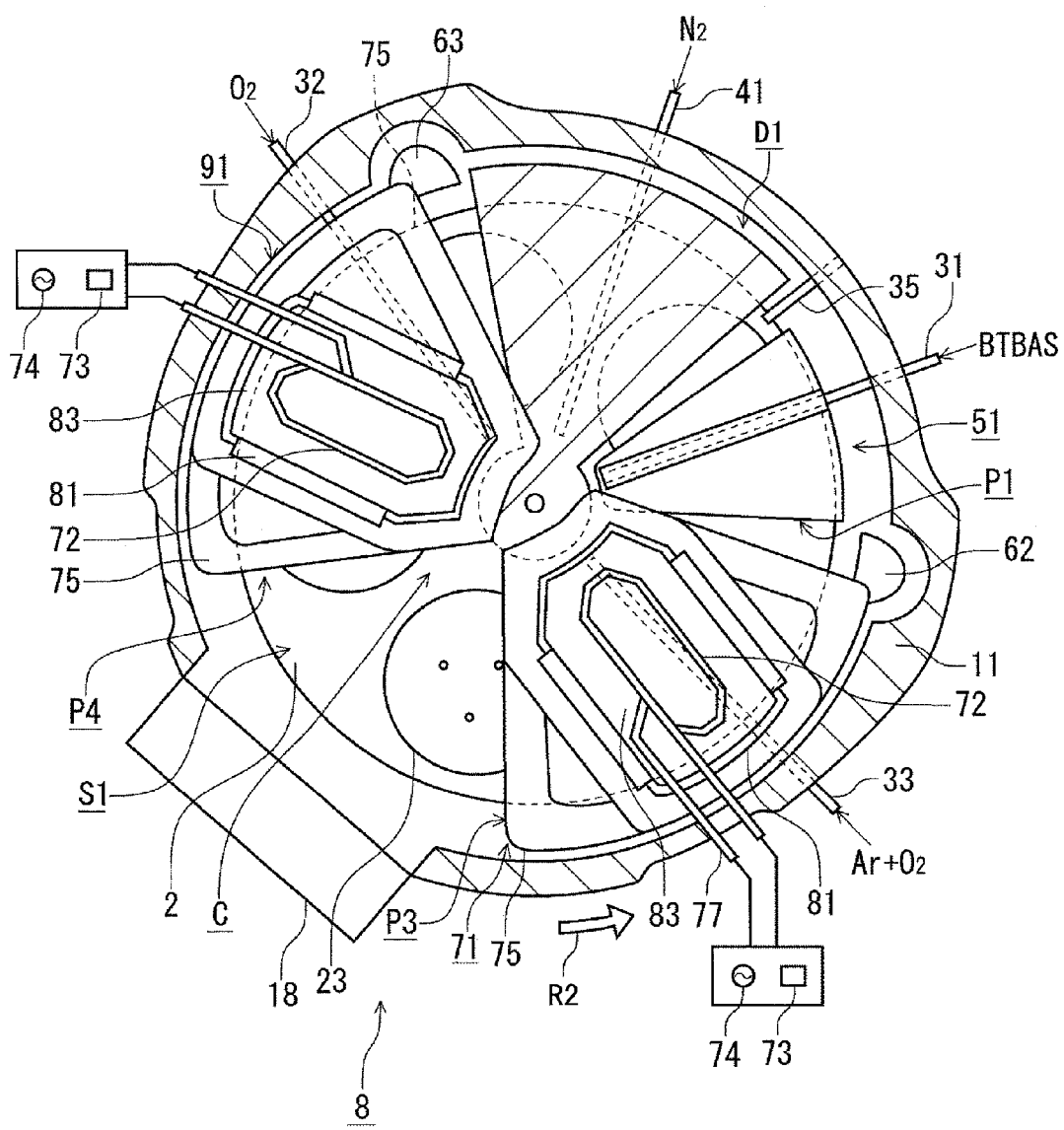
FIG. 11 is a horizontal cross-sectional view illustrating another example of the film deposition apparatus.

FIG. 11 is a horizontal cross-sectional view of a film deposition apparatus 8.

The film deposition apparatus 8 is different from the film deposition apparatus 1 in the following points. The second reaction gas nozzle 32 is configured to supply $O_2$ gas as the second reaction gas, a plasma processing unit 91 to plasma activate $O_2$ gas is provided and the separation area D2 is not provided. The plasma processing unit 91 is structured similarly as the plasma processing unit 71, and a housing 75 of the plasma processing unit 91 surrounds the second reaction gas nozzle 32 to form a plasma reaction area P4, similarly as that the housing 75 of the plasma processing unit 71 surrounds the gas nozzle for plasma generation 33.

In the film deposition apparatus 8, the first reaction area P1, the separation area D1, the plasma reaction area P4 and the plasma reaction area P3 are provided in the counter-clockwise direction (R2). The turntable 2 is rotated in the counter-clockwise direction (R2) at the film deposition process. With this operation, adsorption of BTBAS gas at the first reaction area P1, formation of $SiO_2$ film at the plasma reaction area P4 and the surface treatment at the plasma reaction area P3 are performed on the wafer W in this order. The plasma generation gas is supplied to the plasma processing unit 71 at a relatively large flow rate so that the mixing of the first reaction gas and the second reaction gas via the plasma reaction area P3 can be prevented. It means that the plasma reaction area P3 in this film deposition apparatus 8 functions as the separation area and the plasma reaction area.

The first vacuum evacuation port 62 is provided at the downstream side of the plasma reaction area P3 and the upstream side of the first reaction area P1 and the second vacuum evacuation port 63 is provided at the downstream side of the separation area D1 and the upstream side of the plasma reaction area P4, in the rotation direction R2. The first reaction gas from the first reaction gas nozzle 31 and the plasma generation gas from the gas nozzle for plasma generation 33 are evacuated by the first vacuum evacuation port 62 at the film deposition process. The second reaction gas from the second reaction gas nozzle 32 is evacuated by the second vacuum evacuation port 63 at the film deposition process.

In this example, the cleaning gas nozzle 35 is provided at the downstream side of the first reaction area P1 and the upstream side of the separation area D1, in the rotational direction. As the nozzle cover 51 is provided at the upstream side in the rotational direction at the film deposition process when seen from the cleaning gas nozzle 35, the turntable 2 is rotated in the same direction (R2) as the film deposition process at the cleaning process. With this operation, etching of the nozzle cover 51 can be prevented. Then, at the cleaning process, similarly as the film deposition apparatus 1, the evacuation from the first vacuum evacuation port 62 is terminated and the evacuation from the second vacuum evacuation port 63 is performed.

As such, a plurality of the plasma processing units may be provided. Further, the embodiment can be adaptable for an apparatus without the plasma processing unit.

In the film deposition apparatus 1 or 8, the vacuum evacuation port 63 that evacuates the second reaction gas, the separation area D (D1 or D2), the nozzle cover 51 and the first vacuum evacuation port 62 that evacuates the first reaction gas are provided in this order in the circumferential direction. Here, the cleaning gas nozzle 35 may be differently positioned as long as the cleaning gas nozzle 35 is capable of supplying the cleaning gas to an area between the nozzle cover 51 and the second vacuum evacuation port 63. Thus, the cleaning gas nozzle 35 is not limited to be provided between the separation area D and the nozzle cover 51 as explained above.

Figure 12:
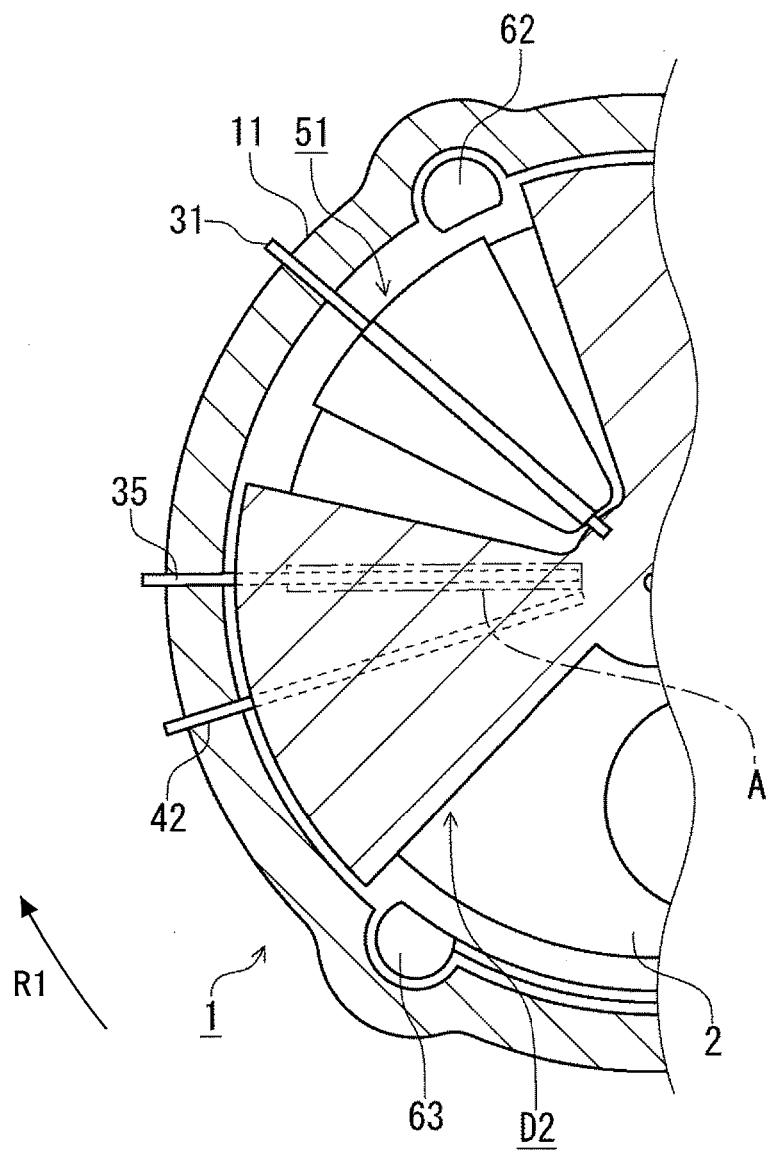
FIG. 12 is a horizontal cross-sectional view illustrating the film deposition apparatus in which a cleaning gas nozzle is provided to another position.

For example, as shown in FIG. 12, the cleaning gas nozzle 35 may be provided in the second separation area D2 in the film deposition apparatus 1. In this example, the cleaning gas nozzle 35 supplies the cleaning gas at its lower side, the cleaning gas supplying area A, similarly as the first separation gas nozzle 41 and the second separation gas nozzle 42. For the example shown in FIG. 12, the cleaning gas nozzle 35 is positioned downstream side of the second separation gas nozzle 42 in the rotation direction (R1) at the film deposition process in the second separation area D2. Alternatively, the cleaning gas nozzle 35 may be positioned at the upstream side of the second separation gas nozzle 42 in the rotational direction. Further, the cleaning gas nozzle 35 may be provided such that the cleaning gas supplying area A is formed between the second separation area D2 and the second vacuum evacuation port 63.

Here, if the distance between the cleaning gas nozzle 35 and the second vacuum evacuation port 63 is too close, the concentration of the cleaning gas at the turntable 2 becomes lowered. Thus, it is preferable that the cleaning gas is supplied to the downstream side of the second separation area D2, as described above. Further, as will be explained later in an evaluation test, the concentration of the cleaning gas above the turntable 2 can be made higher by performing the cleaning process even in an apparatus without the nozzle cover 51. Thus, the present embodiment is adaptable for such an apparatus.

(Evaluation Test)

An evaluation test by a simulation of the cleaning process of the film deposition apparatus 1 of the embodiment is explained.

As an evaluation test 1, the pressure of the vacuum chamber 11 is set to be 50 Torr, the temperature is set to be 550° C. and the rotation speed of the turntable 2 is set to be 5 rpm. The $N_2$ gas supplying amount from the center portion area C and the $N_2$ gas supplying amount from the purge gas supplying portion 29 are set to be 2 slm and 4.3 slm, respectively, and the $N_2$ gas supplying amounts from the first separation gas nozzle 41 and the second separation gas nozzle 42 are set to be 2.5 slm, respectively. Further, in the first reaction gas nozzle 41, the $N_2$ gas nozzle supplying amounts at a peripheral end side area from the peripheral end side of the turntable 2 toward the center portion side, a middle area and a center portion side area are set to be 0.05 slm, 0.1 slm and 0.5 slm, respectively. Then, the cleaning gas nozzle 35 is configured to supply $F_2$ gas at a flow rate of 1 slm. Under this condition, a mass rate distribution of fluorine around the first reaction area P1 is analyzed.

This analysis is performed for a distribution at a height 1 mm apart from the turntable 2 and a distribution at a height 7 mm apart from the turntable 2. The height 1 mm apart from the turntable 2 is below the nozzle cover 51 and the height 7 mm apart from the turntable 2 is above the nozzle cover 51. However, in the evaluation test 1, different from the above embodiment, the evacuation is performed both from the first vacuum evacuation port 62 and the second vacuum evacuation port 63.

Figure 13:
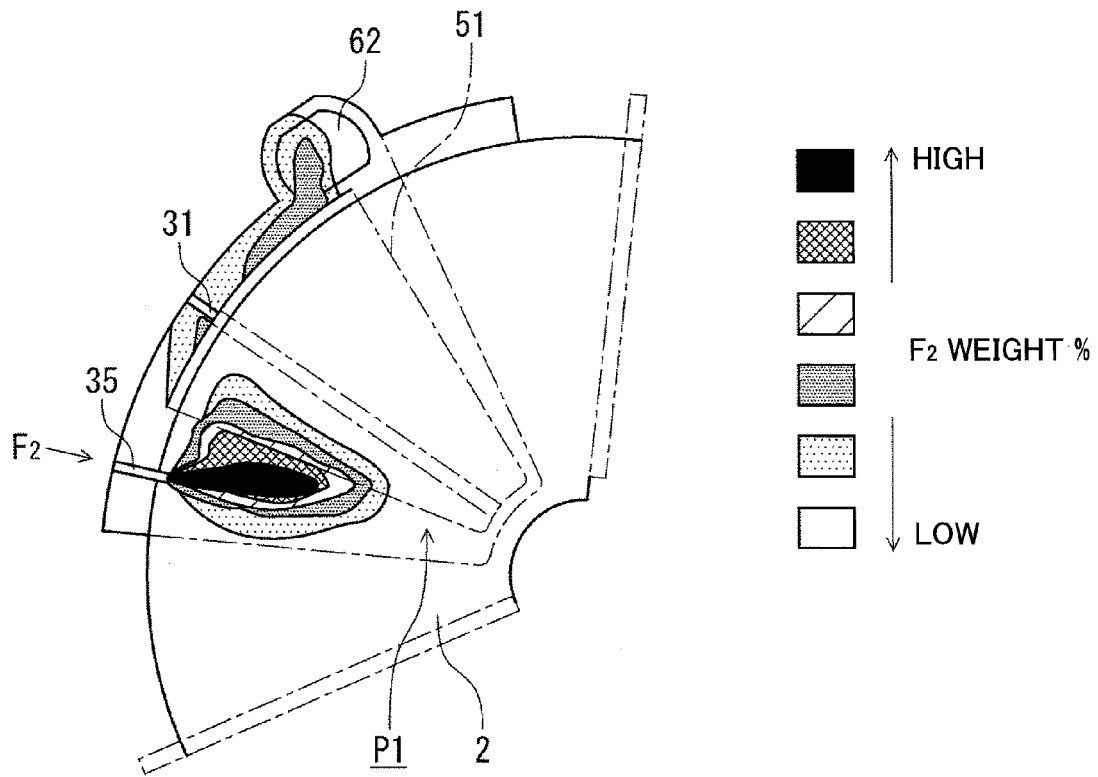
FIG. 13 is a schematic view illustrating a result of an evaluation test.
Figure 14:
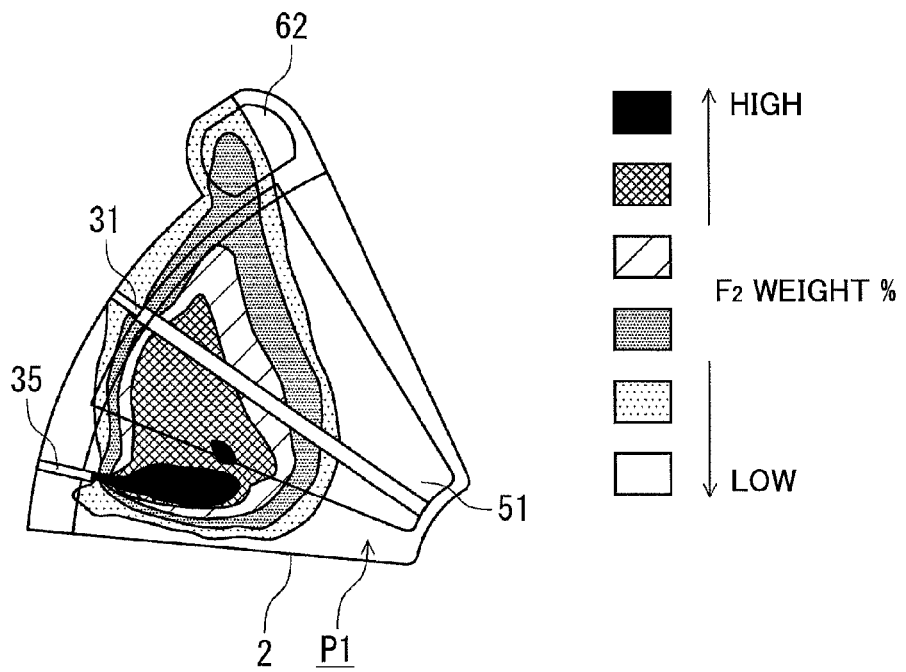
FIG. 14 is a schematic view illustrating a result of an evaluation test.

FIG. 13 and FIG. 14 illustrate results of the evaluation test 1. FIG. 13 illustrates a mass rate distribution of fluorine at a height 1 mm apart from the turntable 2 and FIG. 14 illustrates a mass rate distribution of fluorine at a height 7 mm apart from the turntable 2. In each of the drawings, the mass rate distribution is expressed by contour lines. When the mass amount is less than 5%, no patterns are added (blank). When the mass amount is more than or equal to 5% and less than 20%, the area is added with rough dots and when the mass amount is more than or equal to 20% and less than 30%, the area is added with dense dots. When the mass amount is more than or equal to 30% and less than 40%, the area is hatched and when the mass amount is more than or equal to 40% and less than 45%, the area is added with a lattice pattern. When the mass amount is more than or equal 45% and less than 50%, the area is filled with black. From FIG. 13 and FIG. 14, it can be understood that the flowing of $F_2$ gas below the nozzle cover 51 is suppressed and most of $F_2$ gas flows above the nozzle cover 51 toward the first vacuum evacuation port 62.

Figure 15:
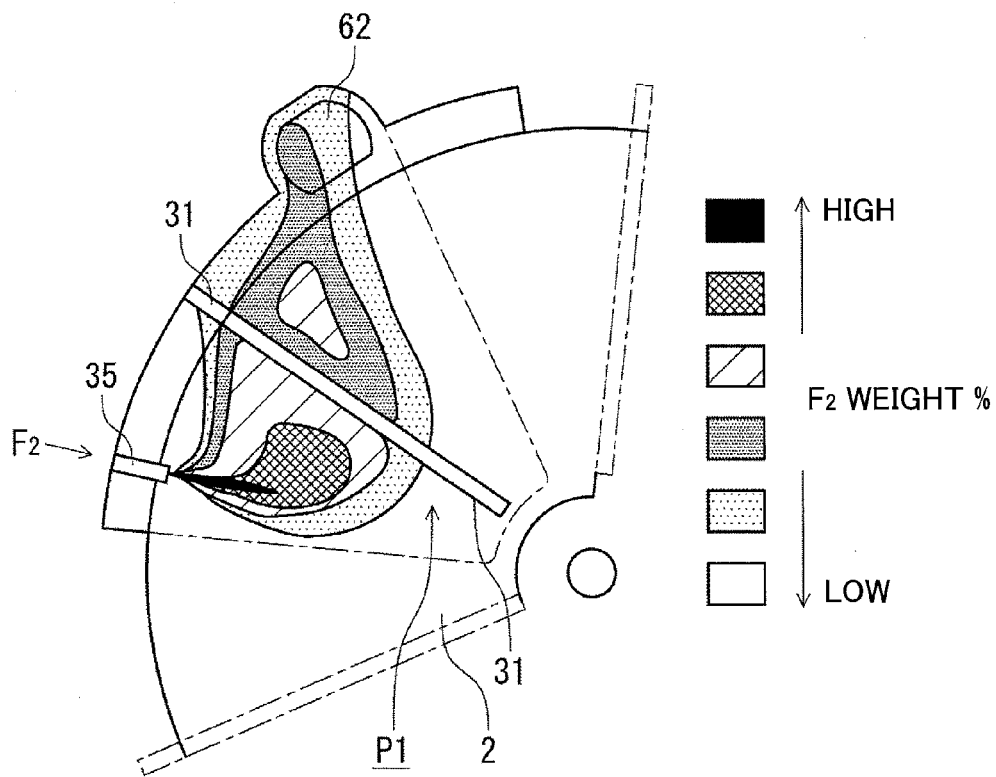
FIG. 15 is a schematic view illustrating a result of an evaluation test.
Figure 16:
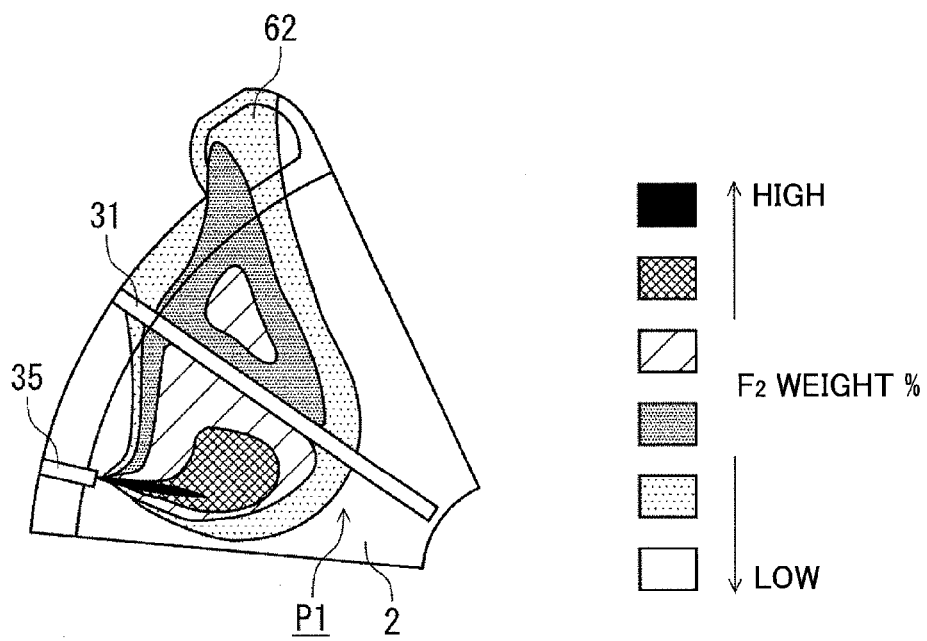
FIG. 16 is a schematic view illustrating a result of an evaluation test.

As an evaluation test 2, the same analysis as the evaluation test 1 is performed except that the nozzle cover 51 is not provided to the first reaction gas nozzle 31. FIG. 15 and FIG. 16 illustrate results of the evaluation test 2. FIG. 15 illustrates a mass rate distribution of fluorine at a height 1 mm apart from the turntable 2 and FIG. 16 illustrates a mass rate distribution of fluorine at a height 7 mm apart from the turntable 2. Compared with the results of the evaluation test 1 and evaluation test 2, it can be understood that the mass rate distribution of $F_2$ gas supplied above the turntable 2 becomes lower by providing the nozzle cover 51.

Subsequently, the evaluation test 3 is explained. The different point from the evaluation test 1 is that the evacuation from the first vacuum evacuation port 62 is not performed at the cleaning process as same as the above embodiment. Further, for other different points, the $N_2$ gas supplying amount from the center portion area C and the $N_2$ gas supplying amount from the purge gas supplying portion 29 are set to be 6 slm and 13 slm, respectively, the $N_2$ gas supplying amounts from the first separation gas nozzle 41 and the second separation gas nozzle 42 are set to be 5 slm, respectively, and the $N_2$ gas supplying amounts from the first reaction gas nozzle 31, the second reaction gas nozzle 32 and the gas nozzle for plasma generation 33 are set to be 0.5 slm, 2 slm and 2.05 slm, respectively. In the evaluation test 3, a mass rate distribution of fluorine at the entirety of the turntable 2 is calculated.

Figure 17:
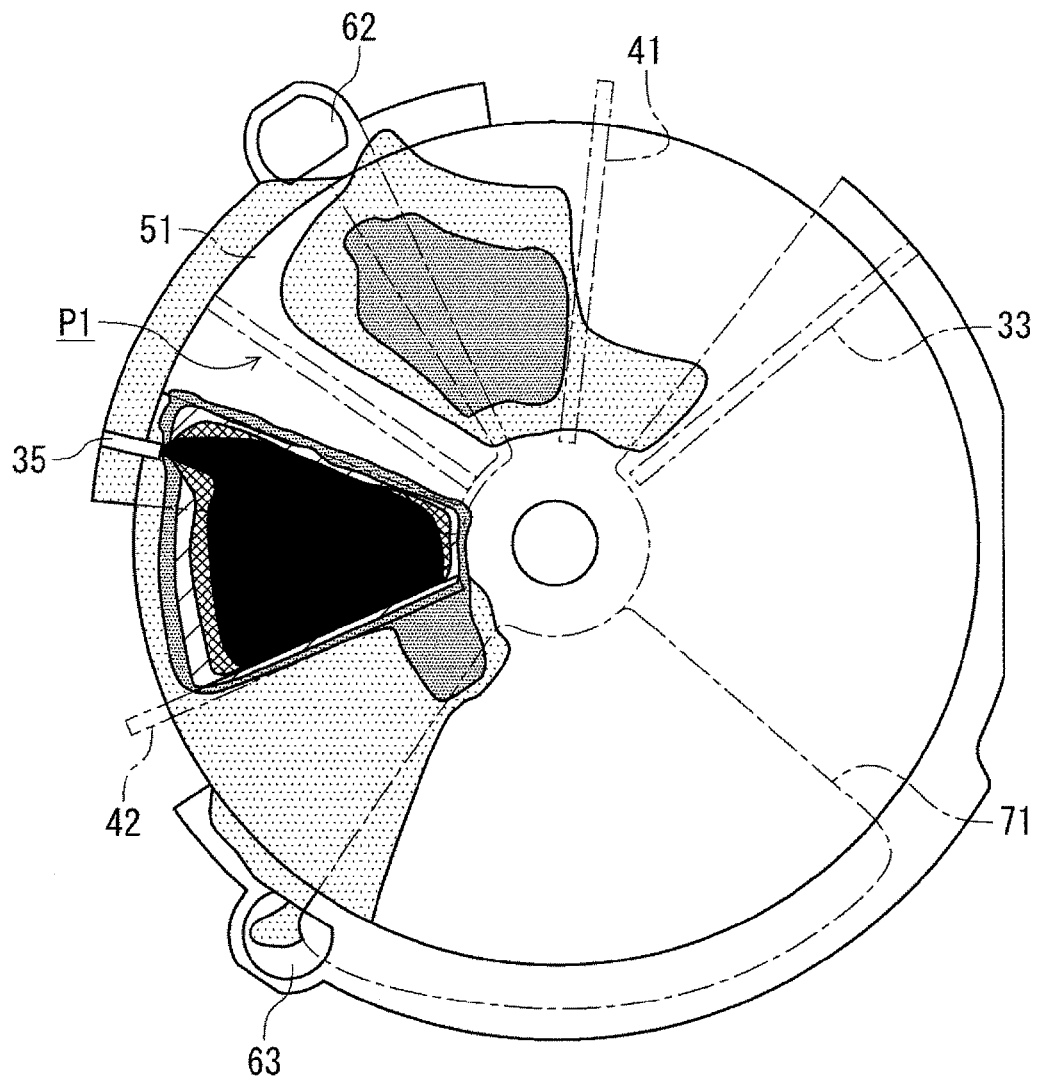
FIG. 17 is a schematic view illustrating a result of an evaluation test.

FIG. 17 is a view illustrating a mass rate distribution of fluorine obtained by the evaluation test 3, similarly to FIG. 13 and FIG. 14. FIG. 17 illustrates the mass rate distribution of fluorine at a height 1 mm apart from the turntable 2. It can be understood that an area with a relatively high gas concentration spreads over the turntable 2 wider than that at the evaluation test 1. Further, the area with a relatively high gas concentration spreads over the turntable 2 wider than that at the evaluation test 2. Thus, according to the evaluation tests 1 to 3, it can be understood that the concentration of the cleaning gas above the turntable 2 can be increased and the cleaning process can be effectively performed by terminating the evacuation from the first vacuum evacuation port 62 as described in the above embodiment. Further, this operation is especially effective for a case in which the nozzle cover 51 is provided because flowing of the cleaning gas above the nozzle cover 51 can be prevented.

According to the embodiment, a problem that the cleaning gas is evacuated toward the first vacuum evacuation port to reduce the amount of the cleaning gas that contacts the turntable caused by a layout or a structure of an apparatus can be solved. Thus, the cleaning process can be effectively performed.

Although a preferred embodiment of the method of operating a film deposition apparatus and the film deposition apparatus has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

What is claimed is:

1. A method of operating a film deposition apparatus in which a cycle of alternately supplying different reaction gasses to a substrate is repeated to stack layers of a reaction product to form a thin film,
the film deposition apparatus including
a vacuum chamber,
a turntable provided in the vacuum chamber and configured to rotate a substrate mounted thereon,
a first reaction gas supplying portion that supplies a first reaction gas to the substrate,
a second reaction gas supplying portion,
being apart from the first reaction gas supplying portion in a rotation direction of the turntable, that supplies a second reaction gas to the substrate,
a separation area, provided between the first reaction gas supplying portion and the second reaction gas supplying portion in the rotation direction of the turntable of a film deposition process, and to which a separation gas for separating the first reaction gas and the second reaction gas is supplied,
a first vacuum evacuation port for mainly evacuating the first reaction gas,
a second vacuum evacuation port, being apart from the first vacuum evacuation port in the rotation direction of the turntable, for mainly evacuating the second reaction gas, and
a cleaning gas supplying portion for supplying a cleaning gas to clean the turntable,
the method comprising:
a cleaning step of supplying the cleaning gas from the cleaning gas supplying portion into the vacuum chamber while terminating the evacuation from the first vacuum evacuation port and performing the evacuation from the second vacuum evacuation port.

2. The method of operating a film deposition apparatus according to claim 1,
wherein the first reaction gas supplying portion includes
a gas nozzle that extends between a peripheral portion and a center portion of the turntable, and
a flow regulating plate provided to extend along a length direction of the gas nozzle such that the separation gas flows above the flow regulation plate.

3. The method of operating a film deposition apparatus according to claim 2,
wherein in the film deposition apparatus, the separation area includes
a first separation area provided between the downstream side of the first reaction gas supplying portion and the upstream side of the second reaction gas supplying portion in a first rotational direction of the turntable of the film deposition process, and
a second separation area provided between the downstream side of the second reaction gas supplying portion and the upstream side of the first reaction gas supplying portion in the first rotational direction,
wherein the first vacuum evacuation port is provided closer to the first separation area side than the first reaction gas supplying portion,
wherein the second vacuum evacuation port is provided closer to the second separation area side than the second reaction gas supplying portion, and
wherein the cleaning gas supplying portion is provided at the upstream side of the first reaction gas supplying portion and the downstream side of the second vacuum evacuation port, in the first rotational direction.

4. The method of operating a film deposition apparatus according to claim 3,
wherein the film deposition apparatus includes
a surface treating area provided at the downstream side of the second reaction gas supplying portion and the upstream side of the second separation area, in the first rotational direction, for performing a surface treatment on the reaction product on the substrate, and a passing area provided between the second reaction gas supplying portion and the surface treating area for passing the substrate between an external substrate transferring mechanism, and wherein the cleaning gas supplying portion is positioned at the downstream side of the surface treating area in the first rotational direction.

5. The method of operating a film deposition apparatus according to claim 1, wherein the cleaning gas supplying portion is positioned closer to the first vacuum evacuation port than to the second vacuum evacuation port in a first rotational direction of the turntable of the film deposition process.

6. The method of operating a film deposition apparatus according to claim 1, wherein in the cleaning step, the turntable is rotated in a second rotational direction opposite to the first rotational direction.

7. The method of operating a film deposition apparatus according to claim 1, wherein the first reaction gas supplying portion is configured to supply a source gas to be adsorbed onto a surface of the substrate and wherein the second reaction gas supplying portion is configured to supply a gas that oxidizes or nitrizes the source gas.

8. The method of operating a film deposition apparatus according to claim 1, wherein the first reaction gas supplying portion includes a gas nozzle that extends between a peripheral portion and a center portion of the turntable, and a flow regulating plate provided to extend along a length direction of the gas nozzle such that the separation gas flows above the flow regulation plate, wherein the cleaning gas supplying portion is provided at the upstream side of the first reaction gas supplying portion and the downstream side of the second vacuum evacuation port, in a first rotational direction of the turntable of the film deposition process, and wherein in the cleaning step, the turntable is rotated in a second rotational direction opposite to the first rotational direction.

* * * * *